(12) United States Patent
Andrews et al.

(10) Patent No.: US 9,054,282 B2
(45) Date of Patent: Jun. 9, 2015

(54) SEMICONDUCTOR LIGHT EMITTING DEVICES WITH APPLIED WAVELENGTH CONVERSION MATERIALS AND METHODS FOR FORMING THE SAME

(75) Inventors: Peter S. Andrews, Durham, NC (US); Ronan P. Le Toquin, Ventura, CA (US); James Ibbetson, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 311 days.

(21) Appl. No.: 12/976,769

(22) Filed: Dec. 22, 2010

(65) Prior Publication Data

US 2011/0089456 A1 Apr. 21, 2011

Related U.S. Application Data

(63) Continuation of application No. 11/835,044, filed on Aug. 7, 2007, now Pat. No. 7,863,635.

(51) Int. Cl.
*H01L 33/00* (2010.01)
*H01L 33/50* (2010.01)
*H01L 33/20* (2010.01)

(52) U.S. Cl.
CPC ............... *H01L 33/508* (2013.01); *H01L 33/20* (2013.01); *H01L 33/504* (2013.01); *H01L 2933/0091* (2013.01)

(58) Field of Classification Search
CPC ..... H01L 33/508; H01L 33/504; H01L 33/20; H01L 2933/0091
USPC .............................. 257/98, E33.059, E33.061
See application file for complete search history.

(56) References Cited

U.S. PATENT DOCUMENTS

| | | |
|---|---|---|
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,325,146 A | 4/1982 | Lennington |

(Continued)

FOREIGN PATENT DOCUMENTS

| | | |
|---|---|---|
| CN | 1767216 A | 5/2006 |
| DE | 3 916 875 | 12/1990 |

(Continued)

OTHER PUBLICATIONS

Chinese Office Action Corresponding to Chinese Application No, 200980121269.2; Date of Notification: Feb. 13, 2012; 9 pages.

(Continued)

*Primary Examiner* — Vongsavanh Sengdara
(74) *Attorney, Agent, or Firm* — Myers Bigel Sibley & Sajovec, P.A.

(57) ABSTRACT

A semiconductor structure includes an active region configured to emit light upon the application of a voltage thereto, a window layer configured to receive the light emitted by the active region, and a plurality of discrete phosphor-containing regions on the window layer and configured to receive light emitted by the active region and to convert at least a portion of the received light to a different wavelength than a wavelength of light emitted by the active region. Methods of forming a semiconductor structure including an active region configured to emit light and a window layer include forming a plurality of discrete phosphor-containing regions on the window layer.

17 Claims, 14 Drawing Sheets

(56) References Cited

U.S. PATENT DOCUMENTS

| | | | |
|---|---|---|---|
| 4,408,157 A | 10/1983 | Beaubien | |
| 4,420,398 A | 12/1983 | Castino | |
| 4,710,699 A | 12/1987 | Miyamoto | |
| 4,772,885 A | 9/1988 | Uehara et al. | |
| 4,918,497 A | 4/1990 | Edmond | 357/17 |
| 4,966,862 A | 10/1990 | Edmond | 437/100 |
| 5,027,168 A | 6/1991 | Edmond | 357/17 |
| 5,087,883 A | 2/1992 | Hoffman | |
| 5,166,815 A | 11/1992 | Elderfield | |
| 5,210,051 A | 5/1993 | Carter, Jr. | 437/107 |
| 5,264,997 A | 11/1993 | Hutchinsson et al. | |
| 5,338,944 A | 8/1994 | Edmond et al. | 257/76 |
| 5,393,993 A | 2/1995 | Edmond et al. | 257/77 |
| 5,407,799 A | 4/1995 | Studier | |
| 5,410,519 A | 4/1995 | Hall et al. | |
| 5,416,342 A | 5/1995 | Edmond et al. | 257/76 |
| 5,477,436 A | 12/1995 | Betling et al. | |
| 5,523,589 A | 6/1996 | Edmond et al. | 257/77 |
| 5,563,849 A | 10/1996 | Hall et al. | |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,779,924 A | 7/1998 | Krames et al. | 216/64 |
| 5,803,579 A | 9/1998 | Turnbull et al. | |
| 5,851,063 A | 12/1998 | Doughty et al. | |
| 5,912,477 A | 6/1999 | Negley | 257/95 |
| 5,959,316 A | 9/1999 | Lowery | |
| 6,043,509 A | 3/2000 | Kurihara et al. | 257/13 |
| 6,066,861 A | 5/2000 | Hohn et al. | |
| 6,071,795 A | 6/2000 | Cheung et al. | 438/458 |
| 6,076,936 A | 6/2000 | George | |
| 6,084,250 A | 7/2000 | Justel et al. | |
| 6,095,666 A | 8/2000 | Salam | |
| 6,120,600 A | 9/2000 | Edmond et al. | 117/89 |
| 6,132,072 A | 10/2000 | Turnbull et al. | |
| 6,144,429 A * | 11/2000 | Nakai et al. | 349/113 |
| 6,187,606 B1 | 2/2001 | Edmond et al. | 438/46 |
| 6,201,262 B1 | 3/2001 | Edmond et al. | 257/77 |
| 6,212,213 B1 | 4/2001 | Weber et al. | |
| 6,234,648 B1 | 5/2001 | Borner et al. | |
| 6,252,254 B1 | 6/2001 | Soules | |
| 6,255,670 B1 | 7/2001 | Srivastava et al. | |
| 6,278,135 B1 | 8/2001 | Srivastava et al. | |
| 6,292,901 B1 | 9/2001 | Lys et al. | |
| 6,294,800 B1 | 9/2001 | Duggal et al. | |
| 6,319,425 B1 | 11/2001 | Tasaki et al. | |
| 6,329,676 B1 | 12/2001 | Takayama et al. | 257/95 |
| 6,335,538 B1 | 1/2002 | Prutchi et al. | |
| 6,337,536 B1 | 1/2002 | Matsubara et al. | |
| 6,348,766 B1 | 2/2002 | Ohishi et al. | |
| 6,350,041 B1 | 2/2002 | Tarsa et al. | |
| 6,357,889 B1 | 3/2002 | Duggal et al. | |
| 6,373,188 B1 | 4/2002 | Johnson et al. | |
| 6,394,621 B1 | 5/2002 | Hanewinkel | |
| 6,420,199 B1 | 7/2002 | Coman et al. | 438/22 |
| 6,429,583 B1 | 8/2002 | Levinson et al. | |
| 6,441,558 B1 | 8/2002 | Muthu et al. | |
| 6,480,299 B1 | 11/2002 | Drakopoulos et al. | |
| 6,501,100 B1 | 12/2002 | Srivastava et al. | |
| 6,504,179 B1 | 1/2003 | Ellens et al. | |
| 6,504,180 B1 | 1/2003 | Heremans et al. | 257/98 |
| 6,513,949 B1 | 2/2003 | Marshall et al. | |
| 6,522,065 B1 | 2/2003 | Srivastava et al. | |
| 6,538,371 B1 | 3/2003 | Duggal et al. | |
| 6,547,249 B2 | 4/2003 | Collins, III et al. | |
| 6,550,949 B1 | 4/2003 | Bauer et al. | |
| 6,552,495 B1 | 4/2003 | Chang | |
| 6,559,075 B1 | 5/2003 | Kelley et al. | 438/795 |
| 6,577,073 B2 | 6/2003 | Shimizu et al. | |
| 6,578,986 B2 | 6/2003 | Swaris et al. | |
| 6,592,810 B2 | 7/2003 | Nishida et al. | |
| 6,600,175 B1 | 7/2003 | Baretz et al. | |
| 6,600,324 B2 | 7/2003 | St-Germain | |
| 6,603,258 B1 | 8/2003 | Mueller-Mach et al. | |
| 6,608,485 B2 | 8/2003 | St-Germain | |
| 6,616,862 B2 | 9/2003 | Srivastava et al. | |
| 6,624,350 B2 | 9/2003 | Nixon et al. | |
| 6,635,503 B2 | 10/2003 | Andrews et al. | |
| 6,636,003 B2 | 10/2003 | Rahm et al. | |
| 6,642,666 B1 | 11/2003 | St-Germain | |
| 6,657,236 B1 | 12/2003 | Thibeault et al. | 257/98 |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,703,173 B2 | 3/2004 | Lu et al. | |
| 6,712,486 B1 | 3/2004 | Popovich et al. | |
| 6,737,801 B2 | 5/2004 | Ragle | |
| 6,744,194 B2 | 6/2004 | Fukasawa et al. | |
| 6,762,563 B2 | 7/2004 | St-Germain | |
| 6,784,463 B2 | 8/2004 | Camras et al. | |
| 6,791,257 B1 | 9/2004 | Sato et al. | |
| 6,791,259 B1 | 9/2004 | Stokes et al. | |
| 6,800,500 B2 | 10/2004 | Coman et al. | 438/22 |
| 6,817,735 B2 | 11/2004 | Shimizu et al. | |
| 6,841,804 B1 | 1/2005 | Chen et al. | |
| 6,851,834 B2 | 2/2005 | Leysath | |
| 6,880,954 B2 | 4/2005 | Ollett et al. | |
| 6,882,101 B2 | 4/2005 | Ragle | |
| 6,885,035 B2 | 4/2005 | Bhat et al. | |
| 6,914,267 B2 | 7/2005 | Fukasawa et al. | |
| 6,936,857 B2 | 8/2005 | Doxsee et al. | |
| 6,957,899 B2 | 10/2005 | Jiang et al. | |
| 6,967,116 B2 | 11/2005 | Negley | |
| 6,980,176 B2 | 12/2005 | Matsumoto et al. | |
| 7,005,679 B2 | 2/2006 | Tarsa et al. | |
| 7,008,078 B2 | 3/2006 | Shimizu et al. | |
| 7,009,199 B2 | 3/2006 | Hall | |
| 7,009,343 B2 | 3/2006 | Lim et al. | |
| 7,014,336 B1 | 3/2006 | Ducharme et al. | |
| 7,023,019 B2 | 4/2006 | Maeda et al. | |
| 7,061,454 B2 | 6/2006 | Sasuga et al. | |
| 7,066,623 B2 | 6/2006 | Lee et al. | |
| 7,083,302 B2 | 8/2006 | Chen et al. | |
| 7,093,958 B2 | 8/2006 | Coushaine | |
| 7,095,056 B2 | 8/2006 | Vitta et al. | |
| 7,102,172 B2 | 9/2006 | Lynch et al. | |
| 7,116,308 B1 | 10/2006 | Heeks et al. | |
| 7,118,262 B2 | 10/2006 | Negley et al. | |
| 7,125,143 B2 | 10/2006 | Hacker | |
| 7,135,664 B2 | 11/2006 | Vornsand et al. | |
| 7,164,231 B2 | 1/2007 | Choi et al. | |
| 7,195,944 B2 | 3/2007 | Tran et al. | |
| 7,207,691 B2 | 4/2007 | Lee et al. | |
| 7,213,940 B1 | 5/2007 | Van De Ven et al. | |
| 7,213,942 B2 | 5/2007 | Jiang et al. | |
| 7,215,074 B2 | 5/2007 | Shimizu et al. | |
| 7,221,044 B2 | 5/2007 | Fan et al. | |
| 7,232,212 B2 | 6/2007 | Iwase | |
| 7,239,085 B2 | 7/2007 | Kawamura | |
| 7,250,715 B2 | 7/2007 | Mueller et al. | |
| 7,255,457 B2 | 8/2007 | Ducharme et al. | |
| 7,256,557 B2 | 8/2007 | Lim | |
| 7,322,732 B2 | 1/2008 | Negley et al. | |
| 7,329,024 B2 | 2/2008 | Lynch et al. | |
| 7,358,954 B2 | 4/2008 | Negley | |
| 7,365,485 B2 | 4/2008 | Fukasawa et al. | |
| 7,387,405 B2 | 6/2008 | Ducharme et al. | |
| 7,422,504 B2 | 9/2008 | Maeda et al. | |
| 7,453,195 B2 | 11/2008 | Radkov | |
| 7,474,044 B2 | 1/2009 | Ge | |
| 7,614,759 B2 | 11/2009 | Negley | |
| 2001/0002049 A1 | 5/2001 | Reeh et al. | |
| 2002/0006044 A1 | 1/2002 | Harbers et al. | |
| 2002/0015013 A1 | 2/2002 | Ragle | |
| 2002/0068201 A1 | 6/2002 | Vaudo et al. | 428/704 |
| 2002/0070681 A1 | 6/2002 | Shimizu et al. | |
| 2002/0087532 A1 | 7/2002 | Barritz et al. | |
| 2002/0123164 A1 | 9/2002 | Slater, Jr. et al. | 438/39 |
| 2002/0139987 A1 | 10/2002 | Collins, III et al. | |
| 2002/0149576 A1 | 10/2002 | Tanaka et al. | |
| 2003/0006418 A1 | 1/2003 | Emerson et al. | 257/79 |
| 2003/0026096 A1 | 2/2003 | Ellens et al. | |
| 2003/0030063 A1 | 2/2003 | Sosniak et al. | |
| 2003/0042908 A1 | 3/2003 | St-Germain | |

(56) References Cited

U.S. PATENT DOCUMENTS

| | | |
|---|---|---|
| 2003/0042914 A1 | 3/2003 | St-Germain |
| 2003/0067302 A1 | 4/2003 | St-Germain |
| 2003/0067773 A1 | 4/2003 | Marshall et al. |
| 2003/0089918 A1 | 5/2003 | Hiller et al. |
| 2003/0146411 A1 | 8/2003 | Srivastava et al. |
| 2003/0209997 A1 | 11/2003 | St-Germain et al. |
| 2003/0222268 A1 | 12/2003 | Yocom et al. |
| 2004/0046178 A1 | 3/2004 | Sano |
| 2004/0051111 A1 | 3/2004 | Ota et al. ............... 257/98 |
| 2004/0056260 A1 | 3/2004 | Slater, Jr. et al. ........ 257/79 |
| 2004/0075399 A1 | 4/2004 | Hall |
| 2004/0105264 A1 | 6/2004 | Spero |
| 2004/0212998 A1 | 10/2004 | Mohacsi |
| 2004/0218387 A1 | 11/2004 | Gerlach |
| 2004/0218388 A1 | 11/2004 | Suzuki |
| 2004/0222735 A1 | 11/2004 | Ragle |
| 2004/0239839 A1 | 12/2004 | Hong |
| 2004/0264193 A1 | 12/2004 | Okumura |
| 2004/0264212 A1 | 12/2004 | Chung et al. |
| 2005/0006659 A1 | 1/2005 | Ng et al. |
| 2005/0007306 A1 | 1/2005 | Iisaka et al. |
| 2005/0051790 A1 | 3/2005 | Ueda ............... 257/99 |
| 2005/0052378 A1 | 3/2005 | Hacker |
| 2005/0116635 A1 | 6/2005 | Walson et al. |
| 2005/0133808 A1 | 6/2005 | Uraya et al. .......... 257/99 |
| 2005/0151138 A1 | 7/2005 | Slater, Jr. et al. ........ 257/79 |
| 2005/0184638 A1 | 8/2005 | Mueller et al. |
| 2005/0190141 A1 | 9/2005 | Roth et al. |
| 2005/0215000 A1 | 9/2005 | Negley ............... 438/200 |
| 2005/0227379 A1 | 10/2005 | Donofrio ............... 438/4 |
| 2005/0231976 A1 | 10/2005 | Keuper et al. |
| 2005/0243556 A1 | 11/2005 | Lynch |
| 2005/0251698 A1 | 11/2005 | Lynch et al. |
| 2005/0253151 A1 | 11/2005 | Sakai et al. |
| 2005/0259423 A1 | 11/2005 | Heuser et al. |
| 2005/0274972 A1 | 12/2005 | Roth et al. |
| 2006/0012989 A1 | 1/2006 | Lee |
| 2006/0022582 A1 | 2/2006 | Radkov |
| 2006/0060872 A1 | 3/2006 | Edmond et al. |
| 2006/0061259 A1 | 3/2006 | Negley |
| 2006/0063289 A1 | 3/2006 | Negley et al. ........... 438/26 |
| 2006/0067073 A1 | 3/2006 | Ting |
| 2006/0090790 A1 | 5/2006 | Kobayashi et al. |
| 2006/0105482 A1 | 5/2006 | Alferink et al. |
| 2006/0105485 A1* | 5/2006 | Basin et al. ............ 438/27 |
| 2006/0113548 A1 | 6/2006 | Chen et al. |
| 2006/0124953 A1 | 6/2006 | Negley et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0180818 A1 | 8/2006 | Nagai et al. |
| 2006/0181192 A1 | 8/2006 | Radkov |
| 2006/0202105 A1 | 9/2006 | Krames et al. |
| 2006/0226759 A1* | 10/2006 | Masuda et al. ............ 313/486 |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0051966 A1 | 3/2007 | Higashi et al. |
| 2007/0069663 A1* | 3/2007 | Burdalski et al. ........... 315/312 |
| 2007/0080361 A1* | 4/2007 | Malm ............... 257/99 |
| 2007/0090381 A1 | 4/2007 | Otsuka et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley |
| 2007/0170447 A1 | 7/2007 | Negley |
| 2007/0171145 A1 | 7/2007 | Coleman et al. |
| 2007/0176193 A1 | 8/2007 | Nagai ............... 257/98 |
| 2007/0202623 A1 | 8/2007 | Gao |
| 2007/0210326 A1 | 9/2007 | Kurihara |
| 2007/0223219 A1 | 9/2007 | Medendorp et al. |
| 2007/0236911 A1 | 10/2007 | Negley |
| 2007/0247414 A1 | 10/2007 | Robert |
| 2007/0247847 A1 | 10/2007 | Villard |
| 2007/0262337 A1 | 11/2007 | Villard |
| 2007/0263393 A1 | 11/2007 | Van De Ven et al. |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley |
| 2007/0280624 A1 | 12/2007 | Negley et al. |
| 2008/0074032 A1 | 3/2008 | Yano et al. |
| 2008/0084685 A1 | 4/2008 | Van De Ven |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0106895 A1 | 5/2008 | Van De Ven |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130265 A1 | 6/2008 | Negley |
| 2008/0130285 A1 | 6/2008 | Negley |
| 2008/0136313 A1 | 6/2008 | Negley |
| 2008/0137347 A1 | 6/2008 | Trott et al. |
| 2008/0158480 A1 | 7/2008 | Ii et al. |
| 2008/0170396 A1 | 7/2008 | Yuan et al. |
| 2008/0179602 A1 | 7/2008 | Negley |
| 2008/0191609 A1 | 8/2008 | Schmidt et al. |
| 2008/0192462 A1 | 8/2008 | Steedly et al. |
| 2008/0192493 A1 | 8/2008 | Villard |
| 2008/0211416 A1 | 9/2008 | Negley et al. |
| 2008/0231170 A1* | 9/2008 | Masato et al. ............... 313/501 |
| 2008/0231201 A1 | 9/2008 | Higley et al. |
| 2008/0259589 A1 | 10/2008 | Van De Ven et al. |
| 2008/0278928 A1 | 11/2008 | Van De Ven et al. |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0304250 A1 | 12/2008 | Harbers et al. |
| 2008/0304260 A1 | 12/2008 | Van De Ven et al. |
| 2008/0304261 A1 | 12/2008 | Van De Ven et al. |
| 2008/0304269 A1 | 12/2008 | Pickard et al. |
| 2008/0309255 A1 | 12/2008 | Myers |
| 2008/0310154 A1 | 12/2008 | Van De Ven et al. |
| 2009/0002986 A1 | 1/2009 | Medendorp et al. |
| 2009/0101930 A1 | 4/2009 | Li |
| 2009/0108269 A1 | 4/2009 | Negley et al. |
| 2009/0166651 A1 | 7/2009 | Beckers |
| 2010/0109575 A1* | 5/2010 | Ansems et al. ............... 315/312 |

FOREIGN PATENT DOCUMENTS

| | | |
|---|---|---|
| DE | 3916875 | 12/1990 |
| DE | 10-335077 | 3/2005 |
| EP | 0 838 866 | 4/1998 |
| EP | 0 971 421 | 1/2000 |
| EP | 1 024 399 | 8/2000 |
| EP | 1 081 771 | 3/2001 |
| EP | 1 160 883 | 12/2001 |
| EP | 1 193 772 | 4/2002 |
| EP | 1 263 058 | 12/2002 |
| EP | 1 367 655 | 12/2003 |
| EP | 1 380 876 | 1/2004 |
| EP | 1 462 711 | 12/2004 |
| EP | 1 566 848 | 8/2005 |
| EP | 1 566 848 A2 | 8/2005 |
| EP | 1 571 715 | 9/2005 |
| EP | 1 571 715 A1 | 9/2005 |
| EP | 1 760 795 | 1/2006 |
| EP | 1 760 795 A2 | 3/2007 |
| JP | 04-159519 | 6/1992 |
| JP | 09-146089 | 6/1997 |
| JP | 10-163535 | 6/1998 |
| JP | H10321906 (A) | 12/1998 |
| JP | 2000-022222 | 1/2000 |
| JP | 2000-183408 | 6/2000 |

(56) References Cited

FOREIGN PATENT DOCUMENTS

| | | |
|---|---|---|
| JP | 2001-111114 | 4/2001 |
| JP | 2001-156331 | 6/2001 |
| JP | 2001-307506 | 11/2001 |
| JP | 2002-150821 | 5/2002 |
| JP | 2002324915 (A) | 11/2002 |
| JP | 2003-515956 | 5/2003 |
| JP | 2004-080046 | 3/2004 |
| JP | 2004-103443 | 4/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005064412 (A) | 3/2005 |
| JP | 2005079202 (A) | 3/2005 |
| JP | 2005-101296 | 4/2005 |
| JP | 2005-142311 | 6/2005 |
| JP | 2005-244226 A | 9/2005 |
| JP | 2006604265 (A) | 2/2006 |
| JP | 2006196777 (A) | 7/2006 |
| JP | 2007049114 (A) | 2/2007 |
| JP | 2007-122950 | 5/2007 |
| JP | 2007-141737 | 6/2007 |
| JP | 2008-071793 A | 3/2008 |
| KR | 100801581 B1 | 2/2008 |
| TW | 546854 | 8/2003 |
| TW | 200603434 | 2/2006 |
| TW | 200623477 | 7/2006 |
| WO | 98/43014 | 10/1998 |
| WO | 99/66483 | 12/1999 |
| WO | 00/34709 | 6/2000 |
| WO | 01/41215 | 6/2001 |
| WO | 01/43113 | 6/2001 |
| WO | 01/69692 | 9/2001 |
| WO | WO 01/69692 A1 | 9/2001 |
| WO | 03/056876 | 7/2003 |
| WO | 03/091771 | 11/2003 |
| WO | WO 2004/038801 A2 | 5/2004 |
| WO | 2004/068909 | 8/2004 |
| WO | 2005/004202 | 1/2005 |
| WO | 2005013365 | 2/2005 |
| WO | WO 2005/022654 A2 | 3/2005 |
| WO | 2005/013365 | 10/2005 |
| WO | 2005/104253 | 11/2005 |
| WO | WO 2005/104247 A1 | 11/2005 |
| WO | 2005/124877 | 12/2005 |
| WO | 2005124877 | 12/2005 |
| WO | 2006/028312 | 3/2006 |
| WO | 2006/061728 A2 | 6/2006 |
| WO | WO 2006/111906 A2 | 10/2006 |
| WO | WO 2006/121196 A1 | 11/2006 |
| WO | 2007/061758 | 5/2007 |
| WO | WO 2009/055079 A1 | 4/2009 |

OTHER PUBLICATIONS

Japanese Office Action Corresponding to Japanese Patent Application No. 2011-506258; Mailing Date: Sep. 14, 2012; 9 Pages.
Kim et al. "Strongly Enhanced Phosphor Efficiency in GaInN White Light-Emitting Diodes Using Remote Phosphor Configuration and Diffuse Reflector Cup" *Japanese Journal of Applied Physics* 44(21):L649-L651 (2005).
Schlotter et al., "Luminescence Conversion of Blue Light Emitting Diodes", App. Phys. A. 64, 417-418 (1997).
International Search Report and Written Opinion (15 pages) corresponding to International Application No. PCT/US2009/002193; Mailing Date: Jul. 20, 2009.
White Light LED, Part Nos. NSPW300BS and NSPW312BS, High Brightness LEDs, Nov. 12, 1999, Publisher: Nichia Corporation.
Chhajed, S., *Influence of junction temperature on chromaticity and color-rendering properties of trichromatic white-light sources . . .* , Journal of Applied Physics, 2005, vol. 97pp. 1-8.
Color Kinetics Inc., Color Kinetics Support : White Papers & Presentations; available at http://www.colorkinetics.com/support/whitepapers/:, Solid State Lighting White Papers & Presentations, Feb. 22, 2006, pp. 1-4.
Color Kinetics Inc., *Color Quality of Intelligent Solid-State Light Systems*, Color Quality of Solid-State Light Sources, Mar. 2005, pp. 1-3.
Compound Semiconductors Online, "LED Lighting Fixtures, Inc. Sets World Record at 80 Lumens per Watt for Warm White", Compound Semiconductors Online, May 30, 2006, pp. 1.
Cree, Inc., "Cree® Xlamp® 7090 XR-E Series LED Binning and Labeling," Application Note: CLD-AP08.000, 7pp (2006).
CSA International, "Test Data Report," Project Number: 1786317, Report Number: 1786317-1 (Apr. 2006).
DOE SSL CALiPer Report, "Product Test Reference: CALiPER 07-31 Downlight Lamp".
DOE SSL CALiPer Report, "Product Test Reference: CALiPER 07-47 Downlight Lamp".
Krames et al., *Lumileds Lighting, Light from Silicon Valley*, Progress and Future Direction of LED Technology, SSL Workshop, Nov. 13, 2003, Publisher: Limileds Lighting Inc., pp. 1-21.
Narendran et al., "Solid State lighting: failure analysis of white LEDs," Journal of Cystal Growth, vol. 268, Issues 1-4, Aug. 2004, Abstract.
Narendran et al., *Color Rendering Properties of LED Light Sources*, 2002, pp. 1-8.
Nichia, White Light LED, Part Nos. NSPW300BS and NSPW312BS, High Brightness LEDs, Nov. 12, 1999, Publisher: Nichia Corporation.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures Announces its first LED-based Recessed Down Light".
Press Release from LED Lighting Fixtures dated Jan. 26, 2006 entitled "LED Lighting Fixtures Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Press Release from LED Lighting Fixtures dated Nov. 28, 2007 entitled "New Lamp from LED Lighting Fixtures Shatter World Record for Energy Efficiency".
Shimizu, "Development of High-Efficiency LED Downlight", First International Conference on White LEDs and Solid State Lighting, Nov. 30, 2007.
U.S. Department of Energy, "DOE Solid-State Lighting CALiPER Program, Summary of Results: Round 3 of Product Testing," Oct. 2007.
U.S. Department of Energy, "DOE Solid-State Lighting CALiPER Program, Summary of Results: Round 4 of Product Testing," Jan. 2008.
U.S. Deptartment of Energy, "DOE Solid-State Lighting CALiPER Program, Summary of Results: Round 5 of Product Testing," May 2008.
Van De Ven et al., "Warm White Illumination with High CRI and High Efficacy by Combining 455 nm Excited Yellowish Phosphor LEDs and Red AlInGaP LEDs," First International Conference on White LEDs and Solid State Lighting, Nov. 30, 2007.
Optoled Lighting Inc., *OptoLED Product Information*, 2009, Publisher: OptoLED GmBH website: accessed at http://222.optoled.de/englisch/products/led.html.
Permlight Inc., *Enbryten LED Product Information*, Feb. 2005, Publisher: Permlight Inc. website; accessed at http://www.webarchive.org displaying that www.permlight.com/products/LEDfixtures.asp was publicly available Jan. 2004.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.

(56) References Cited

OTHER PUBLICATIONS

U.S. Appl. No. 11/751,982, May 22, 2007.
U.S. Appl. No. 11/753,103, filed May 24, 2007.
U.S. Appl. No. 11/751,990, filed May 22, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 12/017,558, filed Jan. 22, 2008.
U.S. Appl. No. 12/017,600, filed Jan. 22, 2008.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.

Boehlen et al., "Laser micro-machining of high density optical structures on large substrates," Proc. of SPIE vol. 5339, 2004, pp. 118-126.
Invitation to Pay Additional Fees and, Where Applicable, Protest Fee (7 pages) corresponding to International Application No. PCT/US2008/009234; Mailing Date: Nov. 14, 2008.
Chinese Second Office Action Corresponding to Chinese Patent Application No. 200980121269.2; Date of Notification: Dec. 19, 2012; 13 Pages.
Office Action, Taiwan Patent Application No. 097102415, Oct. 16, 2013.
Korean Office Action (and translation provided by foreign counsel) corresponding to Korean Application No. 10-2010-7011335, dated Mar. 10, 2014.
Preliminary Rejection issued on Mar. 19, 2015 for corresponding Korean Application No. 10-2010-7026347 (16 pages, including English translation).

* cited by examiner

SEMICONDUCTOR LIGHT EMITTING DEVICES WITH APPLIED WAVELENGTH CONVERSION MATERIALS AND METHODS FOR FORMING THE SAME

CLAIM OF PRIORITY

This application is a continuation of U.S. patent application Ser. No. 11/835,044, filed Aug. 7, 2007, now U.S. Pat. No. 7,863,635 the disclosure of which is hereby incorporated herein by reference as if set forth fully herein.

FIELD OF THE INVENTION

This invention relates to semiconductor light emitting devices and methods of fabricating semiconductor light emitting devices, and more particularly to semiconductor light emitting devices including wavelength conversion materials and methods of forming the same.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

In order to use an LED chip in a circuit, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as phosphor particles. The entire assembly may then be encapsulated in a clear protective resin 14, which may be molded in the shape of a lens to collimate the light emitted from the LED chip 12. The term "phosphor" is used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent and/or phosphorescent. In general, phosphor particles absorb light having low wavelengths and re-emit light having longer wavelengths.

Typically, phosphor particles are randomly distributed within the matrix of encapsulant material. Some or all of the light emitted by the LED chip 12 at a first wavelength may be absorbed by the phosphor particles, which may responsively emit light at a second wavelength. For example, a blue-emitting chip may be encapsulated with an encapsulant matrix including a yellow-emitting phosphor. The combination of blue light (from the chip) with yellow light (from the phosphor) may produce a light that appears white. Some red-emitting phosphor particles may be included in the encapsulant matrix to improve the color rendering properties of the light, i.e. to make the light appear more "warm." Similarly, a UV-emitting chip may be encapsulated with an encapsulant material including phosphor particles that individually emit red, green and blue light upon excitation by UV light. The resulting light, which is a combination of red, green and blue light, may appear white and may have good color rendering properties.

However, rays of light emitted by the chip at different angles may follow different path lengths through the encapsulant material, which may result in the emission of different levels of light from the phosphor as a function of angle of emission. Because light may be emitted by the chip 12 in different intensities depending on the angle of emission, light emitted by the package 10 may have an uneven color distribution. Particle settling may also affect the color uniformity of the emitted light.

Furthermore, the volume of encapsulant material surrounding the LED chip 12 may tend to increase the effective size of the light source, which may increase the difficulty of designing secondary optics for the package.

Accordingly, some techniques for directly coating LED chips with phosphors have been proposed. For example, a phosphor coating technique is described in U.S. Patent Publication No. 2006/0063289, assigned to the assignee of the present invention. Other techniques, such as electrophoretic deposition, have been proposed.

SUMMARY

A semiconductor structure according to some embodiments of the invention includes an active region configured to emit light upon the application of a voltage thereto, a window layer configured to receive the light emitted by the active region, and a plurality of discrete phosphor-containing regions on the window layer and configured to receive light emitted by the active region and to convert at least a portion of the received light to a different wavelength than a wavelength of light emitted by the active region. The window layer may include a substrate, an epitaxial layer, and/or a layer of a transparent material, such as silicone, that maybe applied to the structure.

The phosphor-containing regions include recesses that extend into and/or through the window layer. A first plurality of the recesses may have a first diameter smaller than or about equal to an average diameter of a first type of phosphor particle so that the first plurality of recesses are configured to trap the first type of phosphor particle. A second plurality of the recesses may have a second diameter larger than the first diameter. The second diameter may be smaller than or about equal to an average diameter of a second type of phosphor particle so that the second plurality of recesses are configured to trap the second type of phosphor particle.

The recesses may have a diameter substantially larger than an average diameter of a phosphor particle, and the semiconductor structure may further include a phosphor-loaded matrix material in the recesses. The phosphor-loaded matrix material may include silicone.

The phosphor-containing regions may include islands of phosphor-loaded matrix material on the window layer.

The phosphor-containing regions may include a first plurality of phosphor-containing regions including a first type of phosphor configured to convert light emitted by the active region to a first wavelength and a second plurality of phosphor-containing regions including a second type of phosphor configured to convert light emitted by the active region to a second wavelength.

In some embodiments, the first wavelength may include a wavelength in the yellow portion of the spectrum, the second wavelength may include a wavelength in the red portion of the spectrum, and the active region may be configured to emit light in the blue or UV portions of the spectrum.

In some embodiments, the first wavelength may include a wavelength in the red portion of the spectrum, the second wavelength may include a wavelength in the green portion of the spectrum, and the active region may be configured to emit light in the blue or UV portions of the spectrum.

The semiconductor structure may further include a third plurality of phosphor-containing regions including a phosphor configured to convert light emitted by the active region to a third wavelength. The third wavelength may include a wavelength in the blue portion of the spectrum.

The semiconductor structure may further include a light scattering layer on the window layer. The light scattering layer may be on the plurality of discrete phosphor-containing regions in some embodiments. In some embodiments, the plurality of discrete phosphor-containing regions may be on the light scattering layer.

The window layer may include a preformed layer that is mounted on the active region.

Some embodiments of the invention provide methods of forming a semiconductor structure including an active region configured to emit light and a window layer configured to transmit the emitted light. The methods include forming a plurality of discrete phosphor-containing regions on the window layer. Forming the plurality of discrete phosphor-containing regions may include etching recesses in the window layer and dispensing a phosphor-loaded matrix material into the recesses in the window layer and/or by forming discrete islands of phosphor-loaded matrix material on the window layer.

The recesses may be spaced apart by a distance that is about equal to an average diameter of a phosphor particle, and the recesses may have a diameter that is about the same as the average diameter of a phosphor particle. Forming the plurality of discrete phosphor-containing regions may include passing a phosphor dust including discrete phosphor particles across the window layer such that at least some of the phosphor particles are trapped by the recesses.

Forming the plurality of discrete phosphor-containing regions may include affixing a preformed silicone layer onto a semiconductor wafer. The preformed silicone layer may include a plurality of recesses therein.

Methods of forming a semiconductor structure according to further embodiments of the invention include depositing a layer of matrix material on an LED structure including the active region, selectively curing portions of the matrix material, and removing an unexposed portion of the matrix material to form islands of matrix material on the LED structure.

Selectively curing the matrix material may include forming a mask layer on the deposited layer of matrix material, patterning the mask layer to expose a portion of the matrix material, and curing the exposed portion of the matrix material.

Selectively curing the matrix material may include bringing a heated plate with ridges into proximity with the matrix material, thereby causing selected portions of the matrix material adjacent the heated ridges to cure.

The matrix material may include a phosphor-loaded matrix material. For example, the matrix material may include silicone embedded with phosphor particles. In some embodiments, the methods may further include applying phosphor particles to the deposited layer of matrix material and/or to the islands of matrix material.

Curing the exposed portion of the matrix material may include illuminating the exposed portion of the matrix material with light.

The methods may further include forming a metal contact on a semiconductor wafer. Depositing the layer of the matrix material may include depositing the layer of the matrix material on the semiconductor wafer and the metal contact. The mask layer may cover at least a portion of the metal contact. The methods may further include heat curing the deposited layer of matrix material before forming the mask layer on the deposited layer of matrix material.

The methods may further include depositing a second matrix material on the LED structure including the islands of matrix material, forming a second mask on the second matrix material, patterning the second mask to expose at least a portion of the LED structure other than a portion of the LED structure on which the islands of matrix material are formed, illuminating the exposed portion of the second matrix material with a light having a wavelength sufficient to cure the exposed portion of the second matrix material, and removing an unexposed portion of the second matrix material to form second islands of matrix material on the LED structure.

The methods may further include forming a layer of light-scattering material on the LED structure, The layer of light-scattering material may be formed on the LED structure before and/or after forming the first islands.

The LED structure may include a semiconductor wafer, and the mask layer may be formed at least over a plurality of dicing streets on the semiconductor wafer. The methods may further include dicing the semiconductor wafer after forming the islands of material.

Depositing the layer of matrix material on the LED structure may include spin-coating a matrix material onto the LED structure.

Forming the plurality of discrete phosphor-containing regions on the window layer may include forming a screen on the window layer, the screen including a plurality of openings therein exposing the window layer, depositing phosphor particles in the openings, and removing the screen.

The methods may further include depositing second phosphor particles in regions of the window layer from which the screen was removed. The second phosphor particles may have at least one optical property that is different from the first phosphor particles.

Forming the plurality of discrete phosphor-containing regions on the window layer may include depositing first phosphor particles having a first diameter on the window layer. The first phosphor particles may be deposited so that spaces exist between the first phosphor particles. The methods further include depositing second phosphor particles in the spaces between the first phosphor particles. The second phosphor particles may have at least one optical property that is different from the first phosphor particles.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
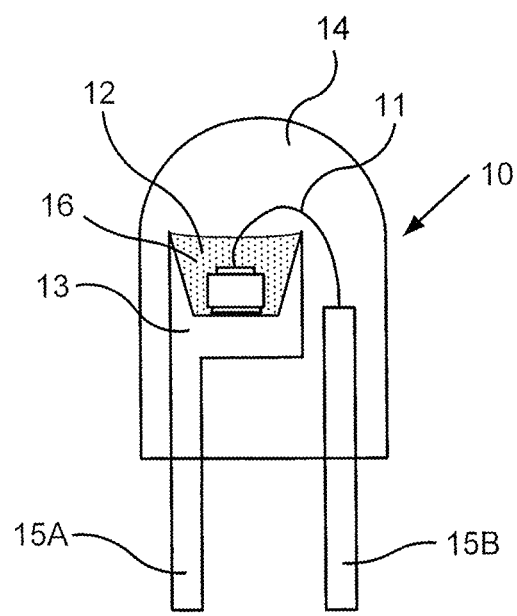
FIG. 1 is a cross-sectional side view illustrating a conventional packaged light emitting device.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials. A light emitting device may or may not include a substrate such as a sapphire, silicon, silicon carbide and/or another microelectronic substrates. A light emitting device may include one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. U.S. 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. U.S. 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. U.S. 2002/0123164 A1.

As discussed above, some methods have been proposed for coating the surface of an LED chip with a phosphor, for example by evaporation and/or electrophoretic deposition. While these methods may be appropriate for the application of a single phosphor material in an LED chip, they may be unsuitable for the deposition of two or more wavelength conversion materials on a single chip.

The deposition of more than one phosphor material on an LED chip may be desirable under certain circumstances. For example, it may be desirable to include a red phosphor along with a yellow phosphor on a blue LED chip to improve the color rendering characteristics of the light produced by the chip. That is, it is known that white emitters including a blue light emitting device and a yellow phosphor may have poor color rendering characteristics due to the binary nature of the emitted light. In order to provide better color rendering, a red phosphor, that may also emit light in response to stimulation by light emitted by the blue LED chip, may provide a red light emission complement to the overall light emitted by the LED chip. The resulting light may have a warmer appearance that may give objects a more natural appearance when illuminated. However, the excitation curve of the red phosphor material may overlap with the emission curve of the yellow emitting phosphor, meaning that some light emitted by the yellow phosphor may be reabsorbed by the red phosphor, which may result in a loss of efficiency.

Some embodiments of the present invention provide methods and resulting LEDs structures that include discrete phosphor-containing regions on an outer layer of the LED structure. Different types of phosphors may be contained in separate ones of the discrete phosphor-containing regions, which may provide improved separation of different phosphors for warm white, UV/RGB, and other phosphor applications. Further, phosphors of different colors may be arranged in a desired pattern on a chip to provide a desired emission pattern.

According to some embodiments of the invention, discrete phosphor-containing regions may be provided including phosphor particles suspended in a plurality of discrete matrices. According to some other embodiments of the invention, phosphor particles may be arranged on a surface of an LED structure at the particle level, and may not need to be provided in a matrix.

Figure 2A:
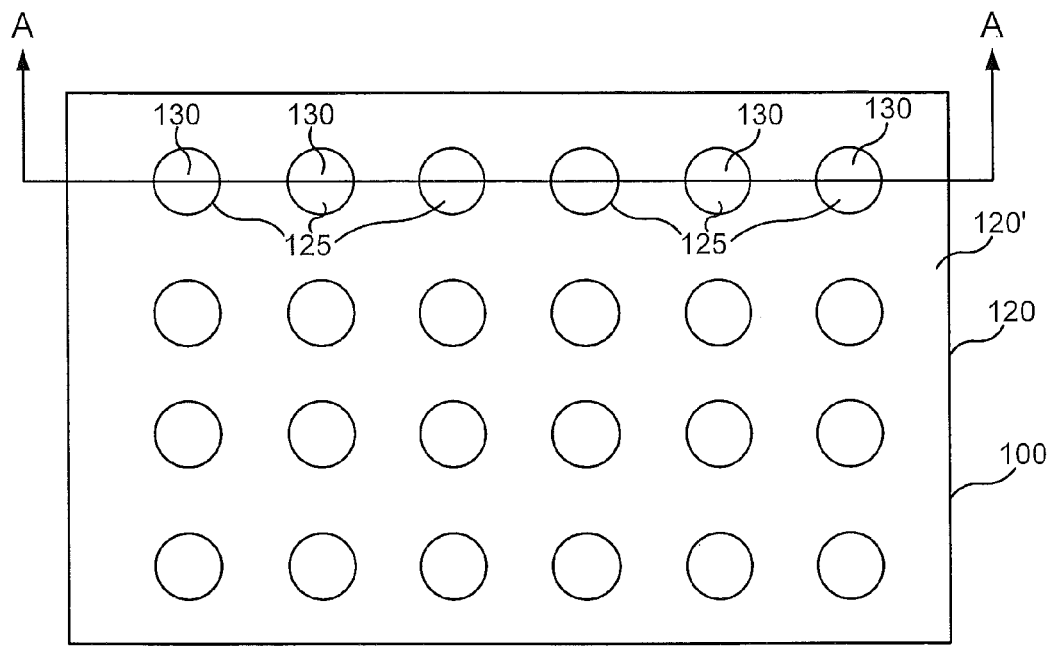
FIG. 2A is a top view illustrating a light emitting device structure including discrete phosphor-bearing regions according to some embodiments of the invention.
Figure 2B:
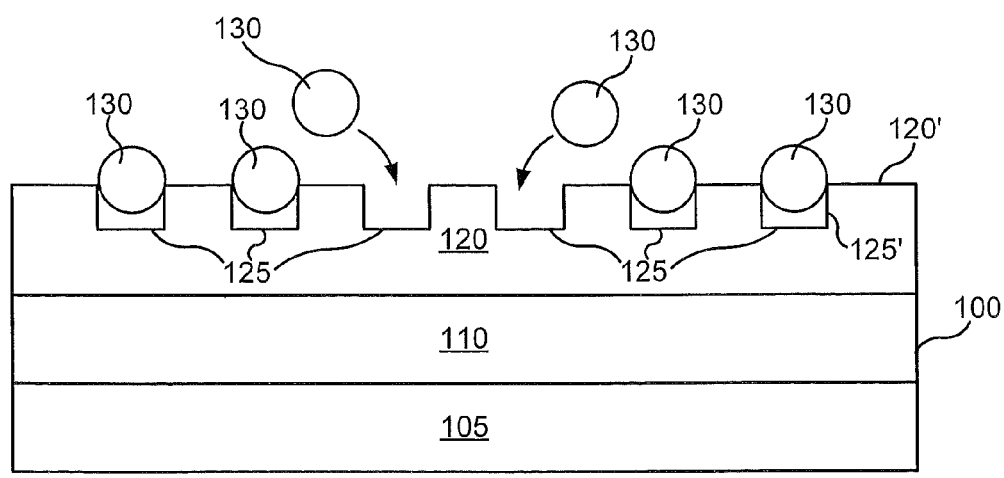
FIG. 2B is a cross-sectional view illustrating the structure of FIG. 2A.

Referring now to FIGS. 2A and 2B, embodiments of the invention are illustrated in which phosphor particles are coated onto a surface of an LED structure 100, which may include a light emitting device and/or a wafer including an LED epitaxial structure and from which a plurality of LED chips may be formed. FIG. 2A is a plan view of a portion of an LED structure 100, and FIG. 2B is a cross section taken along line A-A of FIG. 2A.

In particular, as illustrated in FIGS. 2A and 2B, an LED structure 100 includes an active region 110 between a first window layer 105 and a second window layer 120. Typically, the active region includes a PN junction configured to inject minority carriers into one or more quantum well layers when a voltage is applied across the junction. When the minority carriers, which are typically electrons, recombine with holes in the quantum well layers, light may be emitted by the quantum well layers. Light generated in the active region 110 may pass through one or both of the window layers 105, 120, and may be extracted from an LED chip through one or both of the window layers 105, 120.

The first and/or second window layers 105, 120 may include a substrate or epitaxial layer on which the active region 110 is formed and/or may include an epitaxial layer formed on the active region 110. Thus, in some embodiments, an LED chip may be formed using an epitaxial layer from which the substrate has been removed. In some embodiments, however, the substrate need not be removed from the LED chip, in which case the substrate may be substantially transparent to light generated by the active region 110, such as silicon carbide and/or sapphire.

If one of the first or second window layers 105, 120 includes a substrate, the substrate may be thinned, for example, by etching, mechanical lapping or grinding and polishing, to reduce the overall thickness of the structure. Techniques for thinning a substrate are described in U.S. Patent Publication No. 2005/0151138 entitled "Methods Of Processing Semiconductor Wafer Backsides Having Light Emitting Devices (LEDS) Thereon And Leds So Formed," the disclosure of which is hereby incorporated by reference as if set forth fully herein. Furthermore, a substrate may be shaped or roughened using sawing, laser scribing or other techniques to introduce geometrical features such as angled sidewalls which may increase light extraction. The substrate may be further etched to improve light extraction using for example the etch process described in US. Patent Publication No. 2005/0215000 entitled "Etching Of Substrates Of Light Emitting Diodes," the disclosure of which is hereby incorporated by reference as if set forth fully herein.

Alternatively, the substrate may be remove entirely by substrate removal techniques such as the techniques taught in U.S. Pat. Nos. 6,559,075, 6,071,795, 6,800,500 and/or 6,420,199 and/or U.S. Patent Publication No. 2002/0068201, the disclosures of which are hereby incorporated by reference as if set forth fully herein.

Referring still to FIGS. 2A and 2B, the second window layer 120 includes a plurality of recesses 125 therein that extend from an outer surface 120' of the window layer 120 towards the active region 110. Each of the recesses 125 may have a diameter that is about the same as, or slightly smaller than, an average diameter of a phosphor particle 130 that may become trapped or engaged by the recess 125. The recesses 125 may be spaced apart by a distance that is about equal to an average diameter of a phosphor particle 130. Individual phosphor particles 130 may be dusted onto the surface 120' of the second window layer 120, where they may become trapped in or by the recesses 125 in the second window layer 120. It will be appreciated that while the recesses 125 are illustrated in FIG. 2B as having vertical sidewalls 125', the sidewalls 125' may be slightly or substantially angled from vertical, depending on the desired shape and/or on the manufacturing process used to form the recesses 125.

In particular embodiments, the phosphor particles may have an average diameter of about 5 μm, while the recesses 125 may have a diameter of about 4 μm or less, and may be spaced apart by a distance of at least about 2 μm to permit the phosphor particles 130 to move around on the surface 120' to find a vacant recess 125 to occupy. However, the specific sizes and spacing of the recesses may depend on the size/type of phosphor particles used. For example, red phosphor particles tend to be larger than yellow phosphor particles. The spacing of the recesses may affect how much blue light escapes unconverted. Larger spacing may be used where a cool white color is desired. For warmer, more yellow light, the spacing may be very close. In some embodiments, multiple layers may be provided to yield more yellow light.

The recesses 125 may be formed in the second window layer 120, for example, by selective etching of the second window layer 120 and/or by laser patterning the second window layer 120, as described in U.S. Patent Publication No. 2005/0227379, the disclosure of which is hereby incorporated by reference as if set forth fully herein. In some embodiments, the recesses may be made by selectively laser ablating a polymer mask to form a desired pattern, and then transferring the pattern to the window layer by applying the mask to the window layer 120 and etching the window layer 120 using the mask, as further described in U.S. Patent Publication No. 2005/0227379.

It will be further appreciated that the sidewalls 125' of the recesses 125 may, in addition to confining the phosphor particles 130, provide increased light extraction efficiency and/or scattering as described for example in U.S. Patent Publication No. 2005/0227379.

Figure 3A:
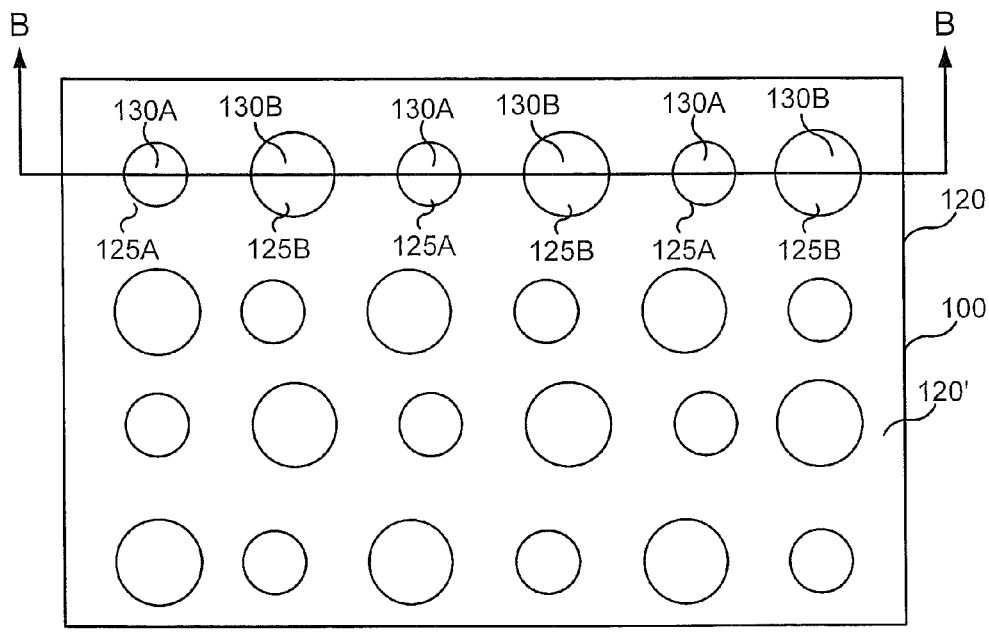
FIG. 3A is a top view illustrating a light emitting device structure including discrete phosphor-bearing regions according to some embodiments of the invention.
Figure 3B:
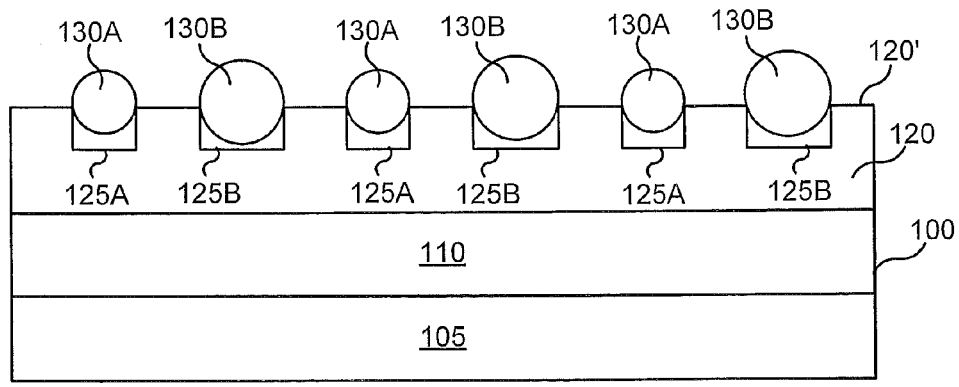
FIG. 3B is a cross-sectional view illustrating the light emitting device structure of FIG. 3A.

Some further embodiments of the invention are illustrated in FIG. 3A, which is a plan view of a portion of an LED structure 100, i.e. an LED chip and/or an LED wafer from which a plurality of LED chips may be formed, and FIG. 3B, which is a cross section taken along line B-B of FIG. 3A. As shown in FIGS. 3A and 3B, the second window layer 120 may include a first plurality of recesses 125A and a second plurality of recesses 125B, wherein the first plurality of recesses 125A have a diameter that is smaller than the diameter of the second plurality of recesses 125B. Corresponding smaller phosphor particles 130A and larger phosphor particles 130B are engaged or trapped by the smaller and larger recesses 130A, 130B, respectively.

Different phosphor particle sizes may be employed for various reasons. For example, different color phosphors may have different average particle sizes. Thus, by arranging the smaller and larger recesses in a desired pattern, a desired pattern of phosphor particles may be formed on the LED structure 100. For example, the small and large recesses 125A, 125B may be arranged such that the distribution of small and large recesses 125A, 125B, and therefore the distribution of smaller and larger phosphor particles 130A, 130B, is uniform or random. Alternatively, the distribution of smaller and larger phosphor particles 130A, 130B may be controlled to provide a desired light output characteristic from devices fabricated from the LED structure 100. For example, a larger concentration of smaller recesses 125A may be provided near edges of a chip, or vice-versa, to provide a desired light emission characteristic.

Furthermore, the relative concentration of small and large recesses 125A, 125B may be selected to provide a desired ratio between large and small phosphor particle sizes on the LED structure 100. Such a ratio may be desirable in order to provide increased uniformity of light emission characteristics. In general, large phosphor particles are more efficient converters. Larger particles may also appear less dense and may result in less light scattering than smaller, less efficient particles. Spacing between large phosphor particles may therefore be an important consideration for producing uniform light.

Figure 4:
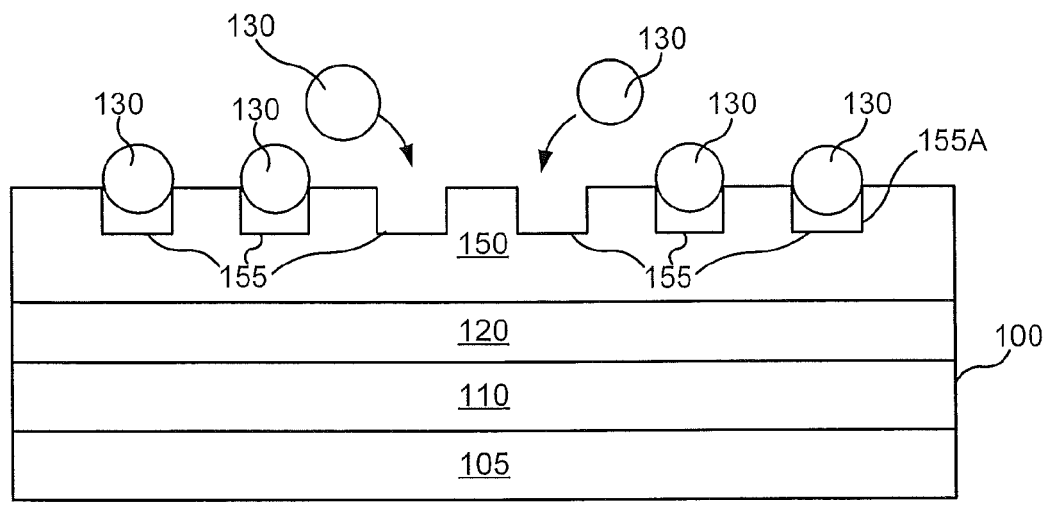
FIG. 4 is a cross-sectional view illustrating a light emitting device structure including discrete phosphor-bearing regions according to some embodiments of the invention.

Further embodiments of the invention are illustrated in FIG. 4, in which an LED structure 100 including an active region 110 between first and second window layers 105, 120 is provided. A preformed layer 150 of, for example, patterned silicone, is mounted on the second window layer 120. The preformed layer 150 includes recesses 155 configured to engage and trap phosphor particles 130 therein, as described above. However, it will be appreciated that it may be easier and/or less expensive to pattern a preformed layer 150 than it is to pattern an epitaxial layer and/or substrate of the LED structure 100. Accordingly, light generated in the active region 110 may pass through the second window layer 120 and into the preformed layer 150, where it may be extracted and scattered by the recesses 155 and wavelength-converted by the phosphor particles 130.

In some embodiments, the preformed layer may include a photopatternable silicone material, such as WL-5150 photopatternable silicone material available from Dow Corning. The recesses 155 may be etched into such material after spin-on deposition using conventional mask/exposure/development techniques, as discussed in more detail below.

Figure 5:
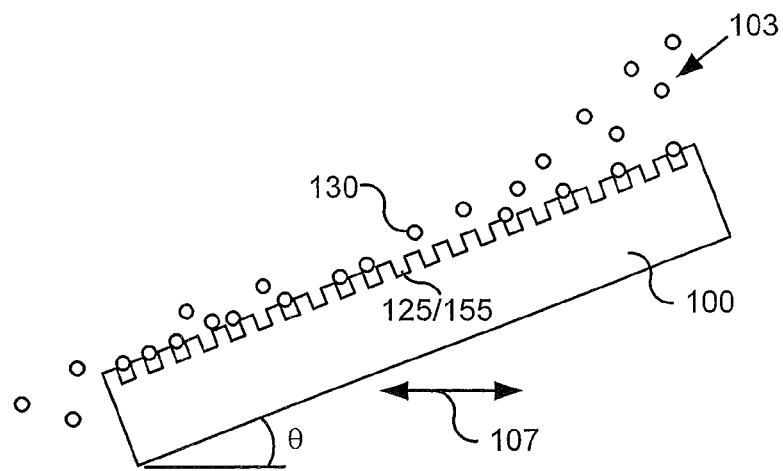
FIG. 5 is a cross sectional view illustrating deposition of phosphor particles on a light emitting device structure according to some embodiments of the invention.

Some methods of applying phosphor particles to an LED structure 100 including recesses 125, 155 as described above are illustrated in FIG. 5. As shown therein, the LED structure 100 may be tilted at an angle θ, and a dry phosphor powder 103 including phosphor particles 130 may be dusted over the LED structure 100. The LED structure 100 may be vibrated while the powder is being dusted, as indicated by arrow 107, to cause the phosphor particles to move about the surface of the LED structure 100 to find a vacant location. Some of the phosphor particles 130 may spill over the edge of the LED structure 100, where they may be recovered for later use.

Figure 6A:
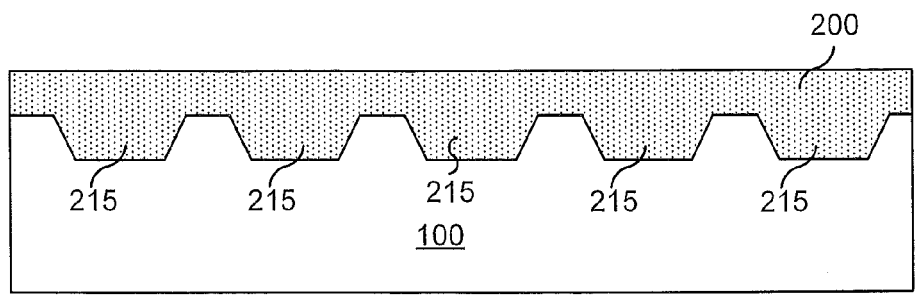
FIGS. 6A-6D are cross sectional views illustrating light emitting device structures including discrete phosphor-bearing regions according to further embodiments of the invention.
Figure 6B:
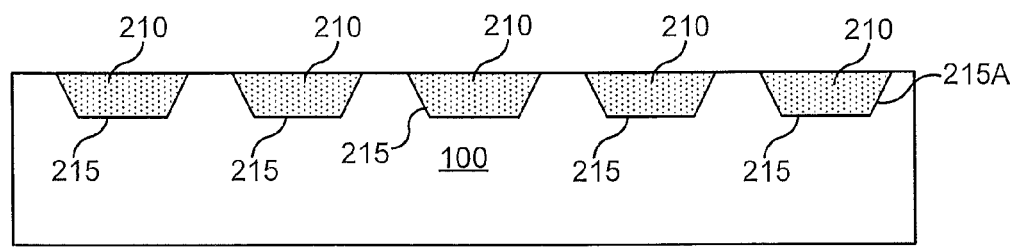

Further embodiments of the invention are illustrated in FIGS. 6A and 6B, in which a plurality of recesses 215 are formed in a surface of an LED structure 100. The LED structure 100 may include an active region, one or more window layers, and/or a substrate as described above in connection with the embodiments of FIGS. 2 to 5. The recesses 215 may be formed via etching, laser ablation, and or pattern transfer, as described above. A layer of a phosphor-loaded matrix material 200 is formed on the surface of the LED structure 100 including the recesses 215. The phosphor-loaded matrix material 200 may include, for example, a layer of silicone embedded with phosphor particles that maybe spin-coated onto the surface of the LED structure 100. The spin-coated layer of a phosphor-loaded matrix material 200 may have a thickness of about 50 to about 95 μm. The phosphor-loaded matrix material 200 may include one or more types of phosphor particles embedded therein.

Referring to FIG. 6B, the layer of phosphor-loaded matrix material 200 may be partially removed to reveal the surface of the LED structure 100 between the recesses 215, leaving a plurality of discrete phosphor-containing regions 210 in the recesses 215. The layer of phosphor-loaded matrix material 200 may be partially removed, for example, by mechanically abrading or polishing away the layer of phosphor-loaded matrix material 200 until the surface of the LED structure 100 is revealed.

Figure 6C:
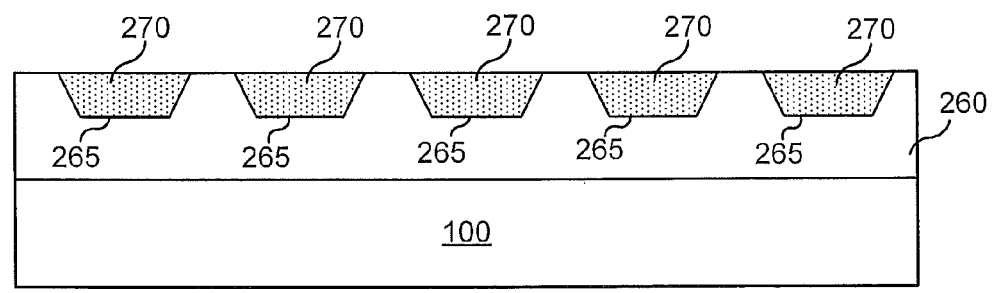

Referring to FIG. 6C, discrete phosphor-containing regions 270 may be formed in recesses 265 in a transparent layer 260 formed on the LED structure 100. The transparent layer 260 may include, for example, a photopatternable silicone material, and the recesses 265 may be formed in the layer 260 as described above. In some embodiments, the transparent layer 260 may include a preformed layer including recesses 265 that is applied to the LED structure 100.

Figure 6D:
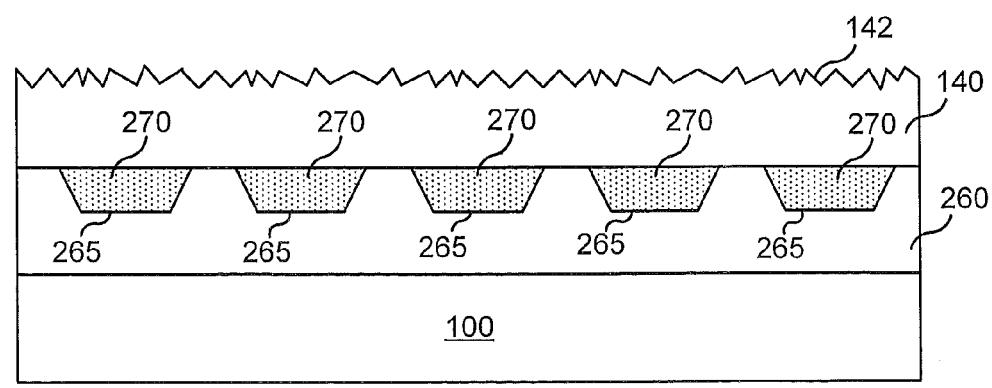

Referring to FIG. 6D, an overlayer 140 may be formed on the LED structure 100 including the discrete phosphor-containing regions 270. The overlayer 140 may include, for example, a layer of silicone or other encapsulant material, and in some embodiments may include a phosphor-loaded material. In some embodiments, the overlayer 140 may include a different phosphor material from the phosphor material contained in the discrete phosphor-containing regions 270. For example, the discrete phosphor-containing regions 270 can include a red phosphor, while the overlayer 140 may include a yellow phosphor, or vice versa.

The overlayer 140 may include other materials/structures that can change optical properties of light emitted by the LED structure 100. For example, the overlayer 140 can include optical diffusing/scattering particles. In some embodiments, a silicone gel can be used to form the overlayer 140 may include $TiO_2$ and/or $SiO_2$ particles having, for example, an average radius less than 1 μm embedded therein for reflectivity. In particular, crushed and/or fumed $SiO_2$ may be used, as may $SiO_2$ glass beads/balls, which may be engineered to a desired size. Accordingly, the overlayer 140 may help to improve the color uniformity of light emitted by the LED structure 100.

As illustrated in FIG. 6D, the overlayer 140 can be textured and/or patterned to increase optical extraction from the device. Although a random texturing 142 is illustrated in FIG. 6D, the texturing can be regular (e.g., periodic or otherwise patterned) in some embodiments if desired to produce a particular emission pattern.

Figure 7A:
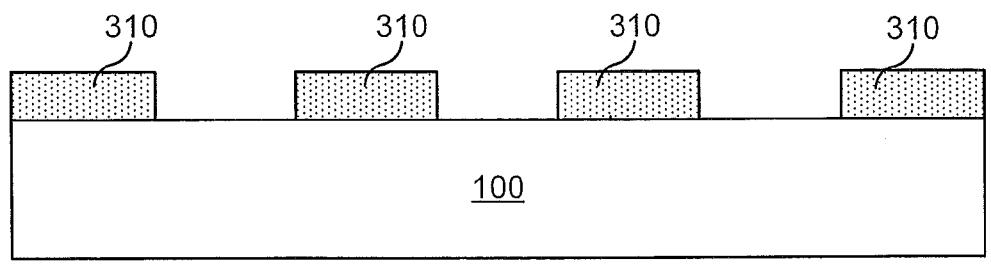
FIGS. 7A-7B are cross sectional views illustrating light emitting device structures including discrete phosphor-bearing regions according to further embodiments of the invention.

Referring to FIG. 7A, according to some embodiments of the invention, discrete phosphor-containing regions 310 may be formed on a surface of an LED structure 100, as described below. In particular, in some embodiments of the invention, discrete phosphor-containing regions 310 may be formed at regular and/or irregular intervals on the surface of the LED structure 100. Furthermore, multiple phosphor-containing regions 310 having different types of phosphors may be formed on the surface of the LED structure 100, as described in more detail below.

Figure 7B:
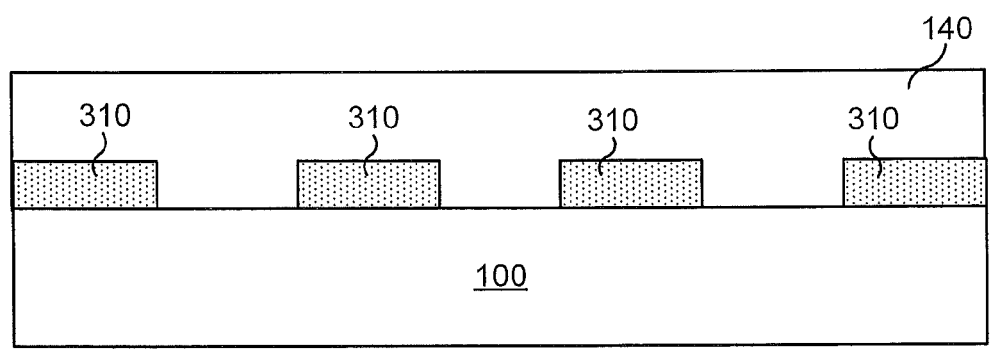

Referring to FIG. 7B, an overlayer 140 may be formed on the LED structure 100 including the discrete phosphor-containing regions 310. The overlayer 140 may include, for example, a layer of silicone or other encapsulant material, and in some embodiments may include a phosphor-loaded material. In some embodiments, the overlayer 140 may include a different phosphor material from the phosphor material contained in the discrete phosphor-containing regions 310. The overlayer 140 may include other materials/structures that can change optical properties of light emitted by the LED, structure 100. For example, the overlayer 140 can include optical diffusing/scattering particles and/or the overlayer 140 can be textured and/or patterned to increase optical extraction from the device.

Figure 8A:
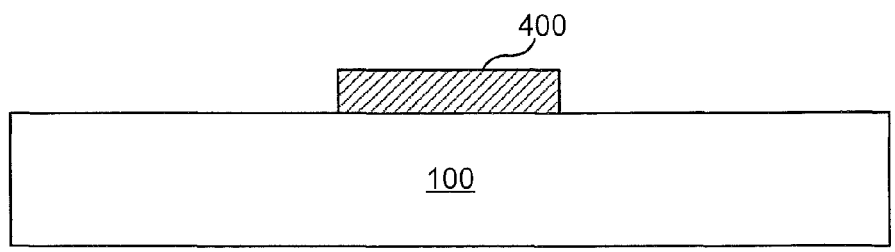
FIGS. 8A-8D are cross sectional views illustrating operations associated with the formation of light emitting diode structures including discrete phosphor-bearing regions according to some embodiments of the invention.
Figure 8B:
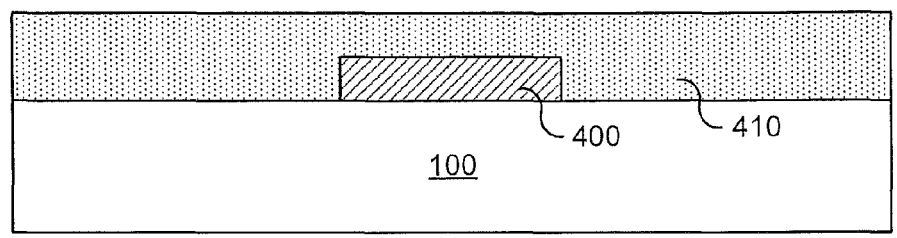
Figure 8C:
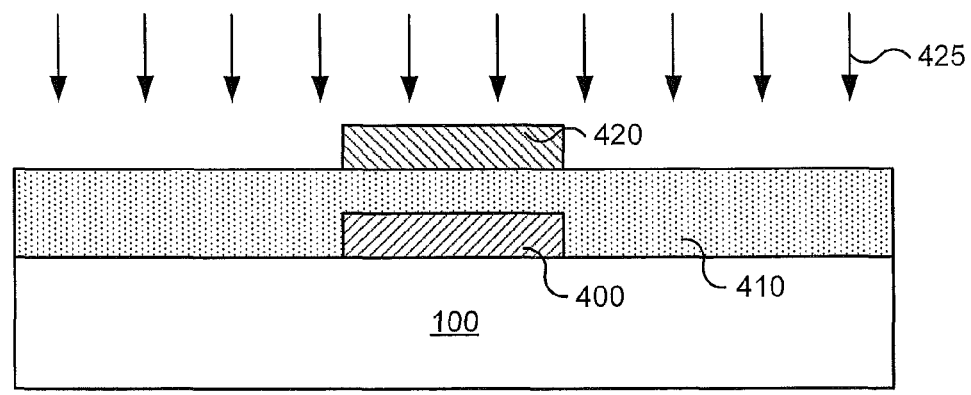

Referring now to FIGS. 8A-8D, the formation of discrete phosphor-containing regions on an LED structure, such as the discrete phosphor-containing regions 310 shown in FIG. 7, is illustrated. In particular, a bond pad 400 is formed on a surface of an LED structure 100. While only a single bond pad 400 is shown in FIGS. 8A-8D, it will be appreciated that prior to dicing, an LED structure 100 may have many hundreds or even thousands of such bond pads 400 thereon. A layer 410 of a photopatternable phosphor-loaded matrix material is deposited on the surface of the LED structure 100 and on the bond pad 400, as shown in FIG. 8B. The photopatternable phosphor-loaded matrix material 410 may include WL-5150 from Dow Corning, which may be spin-coated in liquid form onto the LED structure 100. The photopatternable phosphor-loaded matrix material 410 may then be at least partially cured, for example by heating to a sufficient temperature to stabilize the layer 410. Next, a mask 420 is formed on the layer 410, as shown in FIG. 8C. The mask 420 may cover regions on the LED structure 100 from which the matrix material 410 is to be removed.

Figure 8D:
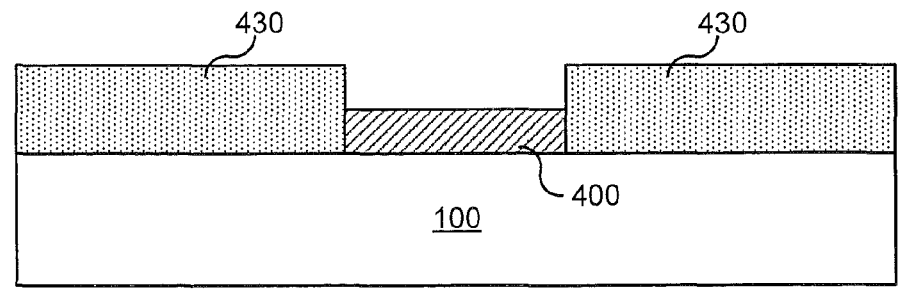

The LED structure 100 is then exposed to light 425 having a wavelength sufficient to cure the photopatternable phosphor-loaded matrix material 410. The uncured portions of the photopatternable phosphor-loaded matrix material 410 below the mask 420 are removed, leaving discrete phosphor-containing regions 430 on the surface of the LED structure 100, as shown in FIG. 8D.

Methods of forming discrete phosphor-containing regions having different types of phosphors are illustrated in FIGS. 9A-9D, which are cross sectional diagrams illustrating operations according to some embodiments of the invention.

Figure 9A:
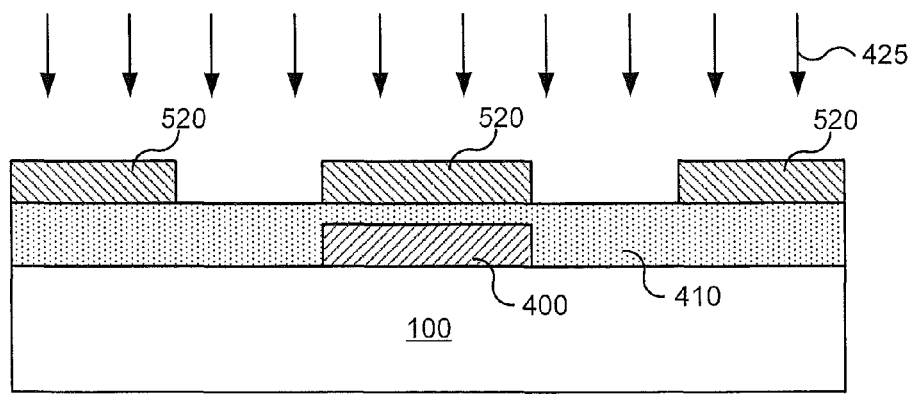
FIGS. 9A-9D are cross sectional views illustrating operations associated with the formation of light emitting diode structures including discrete phosphor-bearing regions according to further embodiments of the invention.

Referring to FIG. 9A, a bond pad 400 is formed on a surface of an LED structure 100, and a first layer 410 of a photopatternable phosphor-loaded matrix material is deposited on the surface of the LED structure 100 and on the bond pad 400. The first photopatternable phosphor-loaded matrix material 410 may include therein a phosphor configured to emit light at a first wavelength in response to excitation by light emitted by an active region in the LED structure 100. The first photopatternable phosphor-loaded matrix material 410 may be spin-coated in liquid form onto the LED structure 100 and then at least partially cured, for example by heating to a sufficient temperature to stabilize the layer 410. A first mask 520 is formed on the layer 410 and may cover regions on the LED structure 100 from which the matrix material 410 is to be removed. The LED structure 100 is then exposed to light 425 having a wavelength sufficient to cure the photopatternable phosphor-loaded matrix material 410.

Figure 9B:
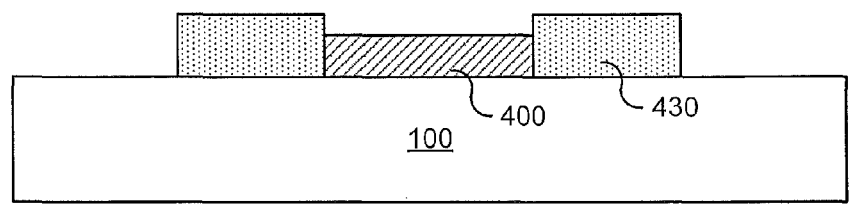

Referring to FIG. 9B, the uncured portions of the photopatternable phosphor-loaded matrix material 410 below the first mask 520 are removed, leaving first discrete phosphor-containing regions 430 on the surface of the LED structure 100.

Figure 9C:
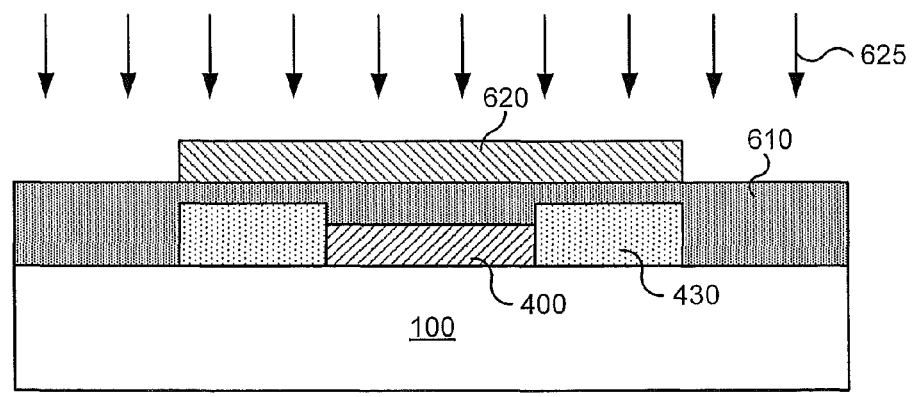

Referring to FIG. 9C, a second layer 610 of a photopatternable phosphor-loaded matrix material is deposited on the surface of the LED structure 100 and on the bond pad 400 and the first discrete phosphor-containing regions 430 on the surface of the LED structure 100. The second photopatternable phosphor-loaded matrix material 610 may include therein a phosphor configured to emit light at a second wavelength, different from the first wavelength, in response to excitation by light emitted by the active region in the LED structure 100.

The second photopatternable phosphor-loaded matrix material 610 may be spin-coated in liquid form onto the LED structure 100 and then at least partially cured, for example by heating to a sufficient temperature to stabilize the layer 610. A second mask 620 is formed on the layer 610 and may cover regions on the LED structure 100 from which the second matrix material 610 is to be removed. The LED structure 100 is then exposed to light 625 having a wavelength sufficient to cure the second photopatternable phosphor-loaded matrix material 610.

Figure 9D:
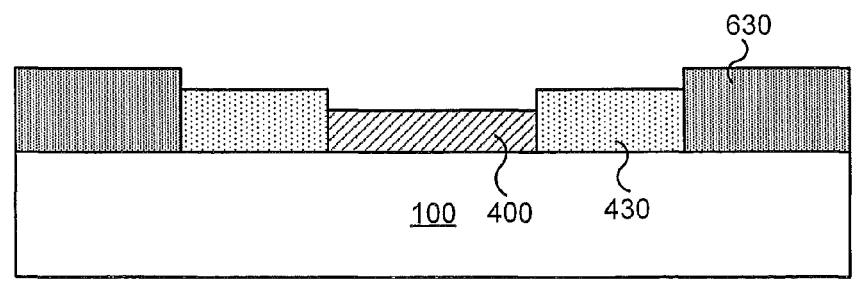

Referring to FIG. 9D, the uncured portions of the photopatternable phosphor-loaded matrix material 610 below the second mask 620 are removed, leaving second discrete phosphor-containing regions 630 on the surface of the LED structure 100 alongside the first discrete phosphor-containing regions 430.

The foregoing process may be repeated a desired number of times to form a plurality of discrete phosphor-containing regions 430, 630 on the surface of the LED structure 100. Moreover, depending on the shapes of the mask layers, the resulting discrete phosphor-containing regions formed on the LED structure 100 may have any desired pattern, such as dots, lines, triangles, hexagons, etc., with any desired periodicity. Further, the discrete phosphor-containing regions 430, 630 formed on the LED structure 100 may be in contact with adjacent phosphor-containing regions and/or may be separated from adjacent phosphor-containing regions. For example, in a warm white LED application, red and yellow phosphors may be physically separated to reduce reabsorption of yellow light by the red phosphors.

In some embodiments, phosphor particles may not be added to the photopatternable matrix materials 410, 610 until after the photopatternable matrix materials 410, 610 have been deposited on the LED structure 100, or until after the discrete regions 430, 630 thereof have been formed on the LED structure 100. For example, in some embodiments, discrete regions 430 of a photopatternable matrix material such as silicone may be formed on an LED structure 100 as shown in FIG. 9B. Phosphor particles may then be embedded in the discrete regions 430, for example, by dipping the wafer in a phosphor suspended solution to phosphor coat the discrete regions 430. In particular, the tacky nature of silicone may allow phosphor particles to stick to the discrete regions 430. Phosphor particles may also be blown onto the discrete regions 430.

Figure 10A:
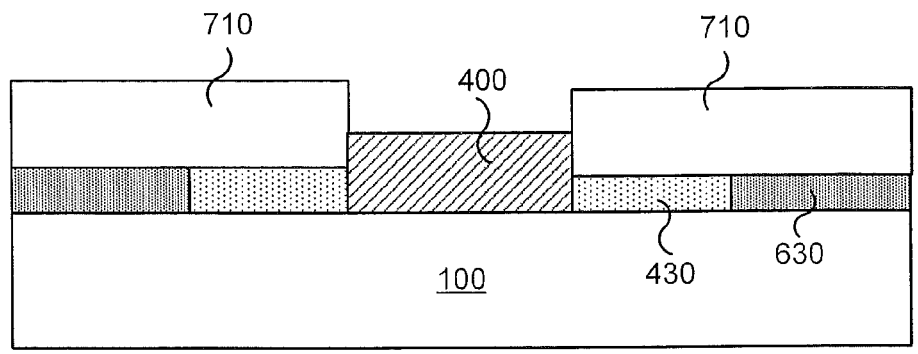
FIGS. 10A and 10B are cross sectional views illustrating light emitting diode structures including discrete phosphor-bearing regions and light scattering regions according to some embodiments of the invention.
Figure 10B:
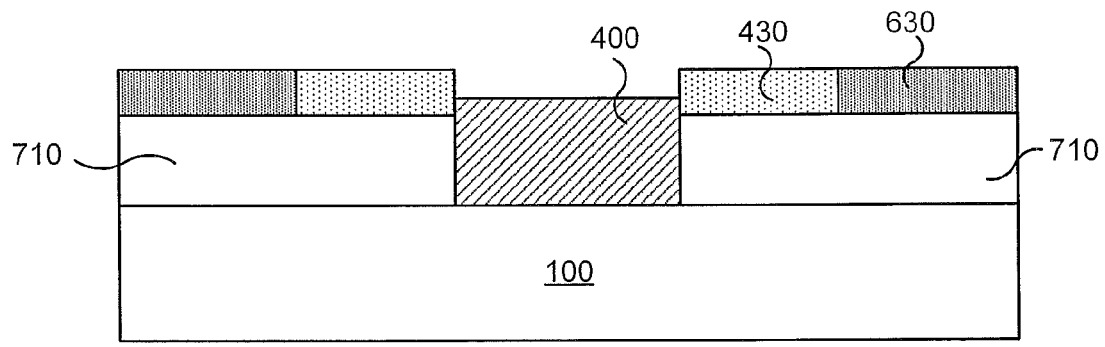

Further embodiments of the invention are illustrated in FIGS. 10A and 10B. As illustrated therein, a light scattering layer 710 may be formed on the discrete phosphor-containing regions 430, 630 (FIG. 10A), and/or the discrete phosphor-containing regions 430, 630 may be formed on a scattering layer 710 (FIG. 10B). The light scattering layer 710 may include a photopatternable silicone layer embedded with light scattering elements, and may be spin-coated on the surface of the LED structure 100 and cured before and/or after formation of the discrete phosphor-containing regions 430, 630.

The silicone gel used to form the light scattering layers 710 may include $TiO_2$ or $SiO_2$ particles having, for example, an average radius less than 1 μm embedded therein for reflectivity. In particular, crushed and/or fumed $SiO_2$ may be used, as may $SiO_2$ glass beads/balls, which may be engineered to a desired size. The light scattering layers 710 may help to improve the color uniformity of light emitted by the LED structure 100.

The light scattering layer 710 may additionally or alternatively include one or more types of phosphor materials to provide further wavelength conversion of light emitted by the LED structure 100.

Figure 11A:
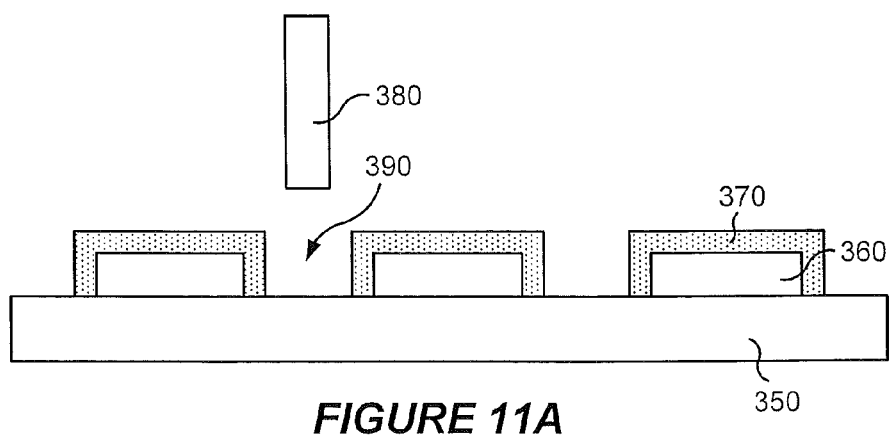
FIGS. 11A and 11B are cross sectional views illustrating the dicing of light emitting diode structures including discrete phosphor-bearing regions according to some embodiments of the invention.
Figure 11B:
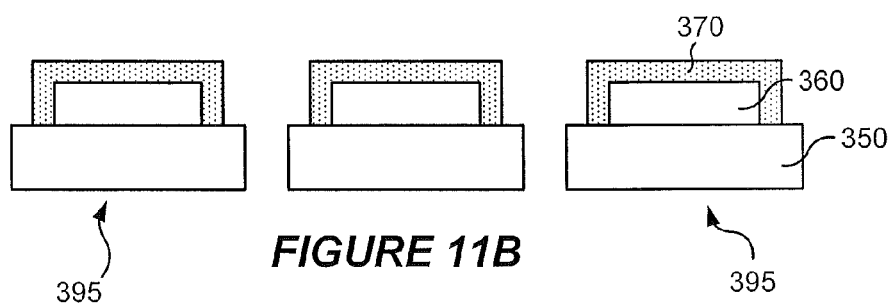

Some further embodiments of the invention are illustrated in FIGS. 11A and 11B. As shown therein, a wafer 350 includes a plurality of light emitting devices 360 thereon. The wafer 350 may be a growth wafer on which the light emitting devices are grown and/or may be a carrier wafer on which the light emitting devices have been mounted. The light emitting devices 360 include a plurality of discrete phosphor-containing regions thereon, which are illustrated schematically by the layers 370 on the light emitting devices 360. Regions 390 between the light emitting devices 360, which may correspond to saw streets, may not include the discrete phosphor-containing regions 370. Accordingly, when wafer is diced, for example using a dicing saw 380, the dicing saw 380 may not cut through the phosphor-containing regions 370. Since the phosphor particles in the phosphor-containing regions 370 are abrasive, it may cause undue wear to the blade of the dicing saw 380 to cut through phosphor-containing regions such as the discrete phosphor-containing regions 370.

Referring to FIG. 11B, the wafer 350 may be diced to provide individual light emitting diodes 395 including discrete phosphor-containing regions 370 thereon.

Figure 12A:
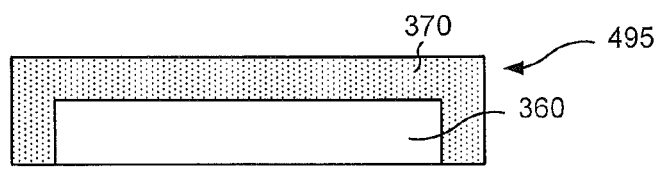
FIGS. 12A-12C are cross sectional views illustrating light emitting diode structures including discrete phosphor-bearing regions and light scattering regions according to some embodiments of the invention.
Figure 12B:
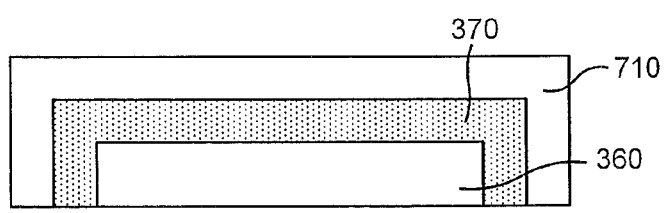
Figure 12C:
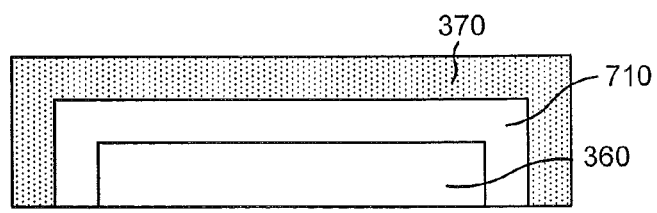

Although the substrate 350 is shown as remaining on the diodes 395 in FIG. 11B, it will be appreciated that the substrate 350 may be removed from the light emitting devices 360. For example, referring to FIG. 12A, a light emitting diode 495 including a light emitting device 360 that has been removed from a substrate is illustrated. As shown in FIG. 12B, a light scattering layer 710 as described above may be formed on the discrete phosphor-containing regions 370, such that the discrete phosphor-containing regions 370 are between the light scattering layer 710 and the light emitting device 360. Or, as illustrated in FIG. 12C, the discrete phosphor-containing regions 370 may be formed on a light scattering layer 710, such that the light scattering layer 710 is between the discrete phosphor-containing regions 370 and the light emitting device 360.

Figure 13:
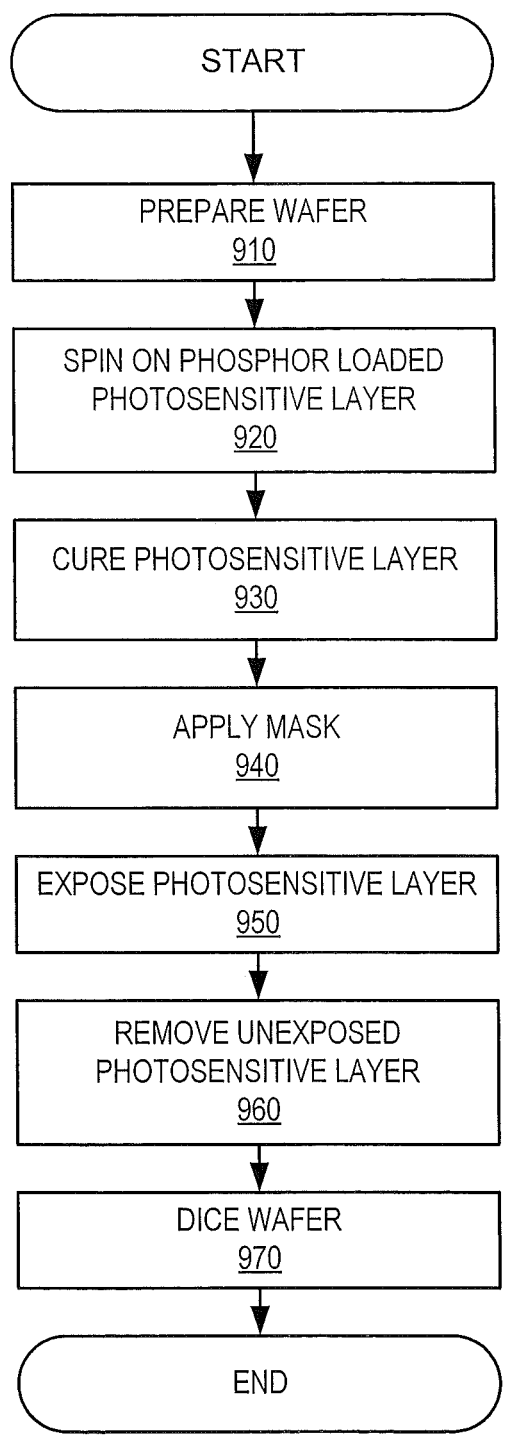
FIG. 13 is a flowchart illustrating operations according to some embodiments of the invention.

Operations according to some embodiments of the invention are illustrated in FIG. 13. Referring to FIGS. 8A-8D and FIG. 13, an LED structure 100 is prepared, for example, by forming an active region and one or more window layers thereon (Block 910). The LED structure 100 may also be mounted and cleaned in preparation for forming discrete phosphor-containing regions thereon. A phosphor loaded photosensitive layer 410, such as a photopatternable silicone, is spin-coated onto the LED structure 100 (Block 920), and the photosensitive layer 410 is at least partially cured, for example, to stabilize the layer (Block 930). The phosphor-loaded photosensitive layer 410 includes therein phosphor particles configured to convert light emitted by the active region in the LED structure 100 to a different wavelength.

A mask 420 is applied to the stabilized phosphor loaded photosensitive layer 410 (Block 940). The mask 420 is patterned to expose portions of the LED structure 100 on which discrete phosphor-containing regions are to be formed. Next, the LED structure 100 including the phosphor loaded photosensitive layer 410 is exposed with light having a wavelength sufficient to cure the phosphor loaded photosensitive layer 410 (Block 950). The mask 420 and the unexposed portions of the phosphor loaded photosensitive layer 410 are then removed (Block 960) to provide discrete phosphor-containing regions 430. The LED structure 100 is then diced to provide individual semiconductor light emitting devices including discrete phosphor-containing regions 430 (Block 970).

Figure 14A:
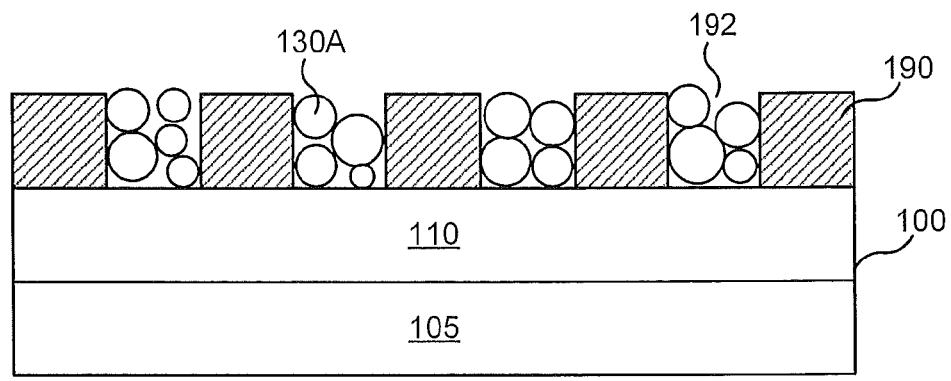
FIGS. 14A-14C are cross sectional views illustrating deposition of phosphor particles on a light emitting device structure according to some embodiments of the invention.
Figure 14B:
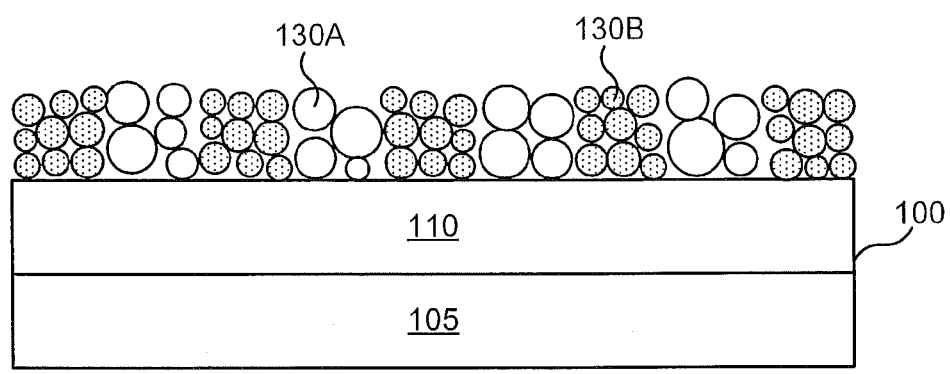

Other methods may be used to apply the phosphor particles 130 to an LED structure 100 in an organized manner. For example, referring to FIG. 14A, a micro-screen 190 can be applied to an LED structure 100 to at wafer level (or die level). The micro-screen 190 can include a material such as a fine filament woven fabric or other material used for filtering particulate materials. Micro-screen filters are well known in the material filtering art. The micro-screen 190 includes openings 192 therein that expose the LED structure 100 and that have a width selected to permit a desired size of phosphor particle 130A to contact the LED structure therethrough. The phosphor particles 130A may be deposited, and then the screen may be removed, leaving the phosphor particles on the LED structure in a desired pattern. Additional particles 130B may then be deposited, and may organize in the spaces previously occupied by the screen, as shown in FIG. 14B. The additional phosphor particles 130B may have at least one optical property different from the phosphor particles 130A. For example, the additional phosphor particles 130B may convert incident light to a different color than the phosphor particles 130A, and/or the additional phosphor particles 130B may scatter incident light in a different pattern than the phosphor particles 130A.

Figure 14C:
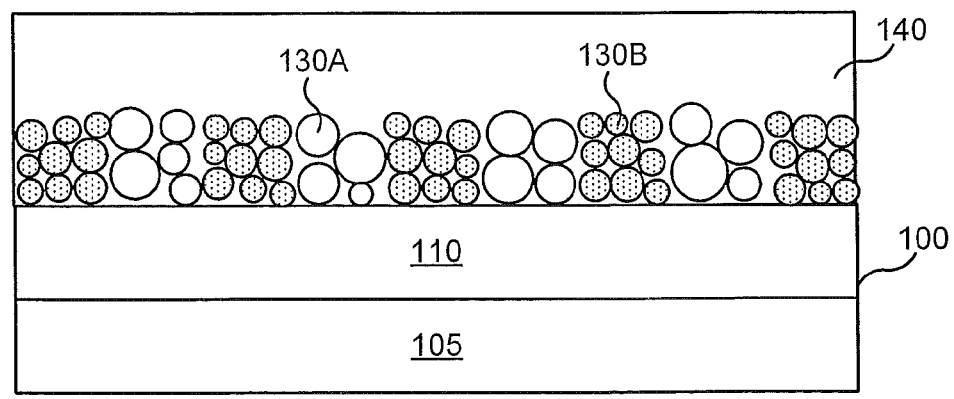

Referring to FIG. 14C, an overlayer 140 may be formed on the LED structure 100 including the organized phosphor particles 130A, 130B. The overlayer 140 may include, for example, a layer of silicone or other encapsulant material, and in some embodiments may include a phosphor-loaded material. In some embodiments, the overlayer 140 may include a different phosphor material from the phosphor material contained in the organized phosphor particles 130A, 130B. The overlayer 140 may include other materials/structures that can change optical properties of light emitted by the LED structure 100. For example, the overlayer 140 can include optical diffusing/scattering particles and/or the overlayer 140 can be textured and/or patterned to increase optical extraction from the device.

Some silicones can be formulated to be very tacky after curing. Such materials are typically referred to as soft gels. This property can be used to advantage by adhering a tacky silicone on a surface and embedding phosphor from a micro-screen loaded with phosphor into the silicone. In other embodiments, a harder silicone with low tack may be used so that phosphor particles can move across a surface as depicted, for example, in FIG. 5.

Figure 15A:
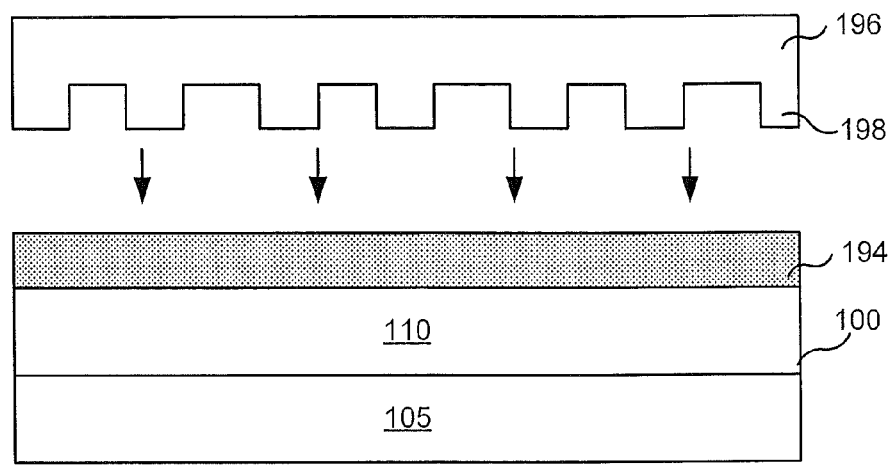
FIGS. 15A-15C are cross sectional views illustrating deposition of phosphor particles on a light emitting device structure according to some embodiments of the invention.
Figure 15B:
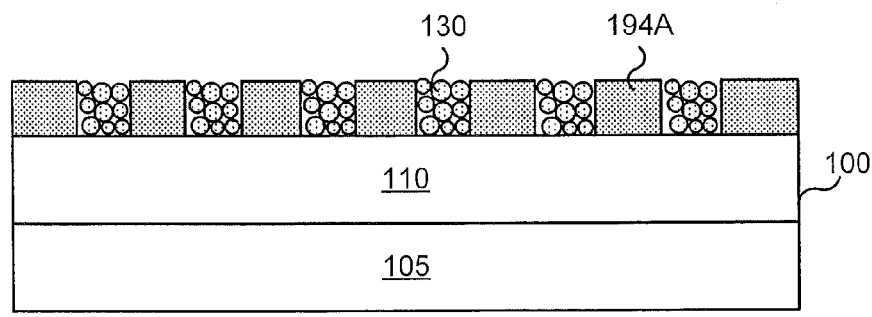

In some embodiments, a transparent layer can be formed by pressing into it in a partial cure state for example, then finishing cure, to form particle organizing layer. For example, referring to FIGS. 15A and 15B, a transparent silicone layer 194 may be formed on an LED structure 100. The silicone layer 194 may or may not include embedded phosphors 130A.

Portions of the transparent layer 194 of, for example, a matrix material such as silicone, may be selectively cured. For example, a heated plate 196 with ridges 198 may be brought into proximity with the silicone layer 194, causing selected portions 194A of the transparent layer 194 adjacent the heated ridges to cure. The remaining uncured portions of the transparent layer 194 are removed, leaving a cured phosphor-organizing layer including cured portions 194A. Additional phosphor particles 130 may be deposited in the space previously occupied by the uncured portions of the transparent layer 194.

Figure 15C:
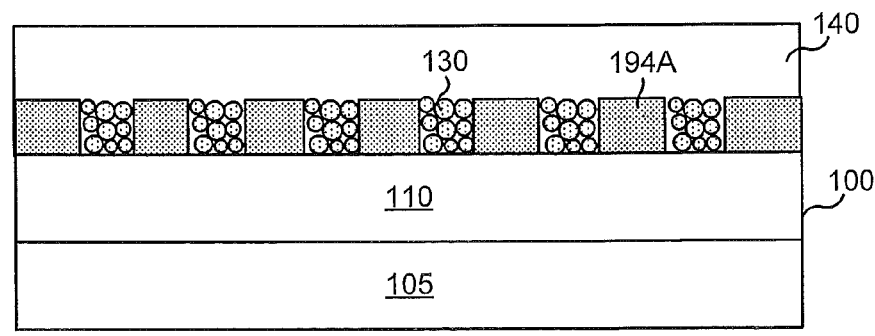

Referring to FIG. 15C, an overlayer 140 may be formed on the LED structure 100 including the phosphor particles 130 and cured portions 194A. The overlayer 140 may include, for example, a layer of silicone or other encapsulant material, and in some embodiments may include a phosphor-loaded material. In some embodiments, the overlayer 140 may include a different phosphor material from the phosphor material contained in the phosphor particles 130. The overlayer 140 may include other materials/structures that can change optical properties of light emitted by the LED structure 100. For example, the overlayer 140 can include optical diffusing/scattering particles and/or the overlayer 140 can be textured and/or patterned to increase optical extraction from the device.

Figure 16A:
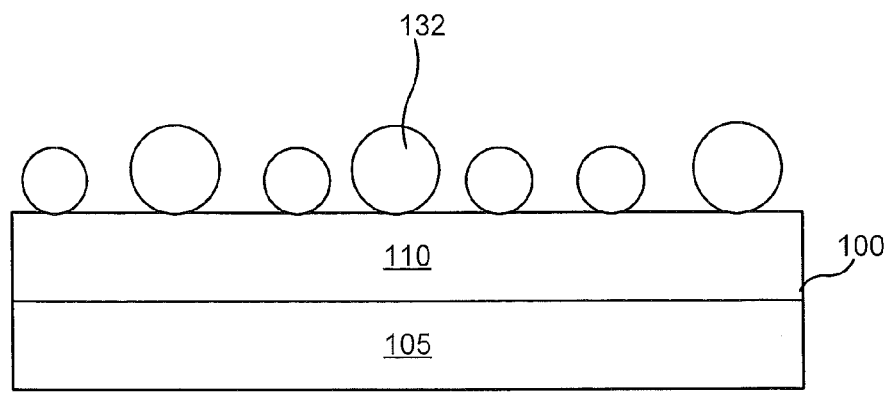
FIGS. 16A-16C are cross sectional views illustrating deposition of phosphor particles on a light emitting device structure according to some embodiments of the invention.
Figure 16B:
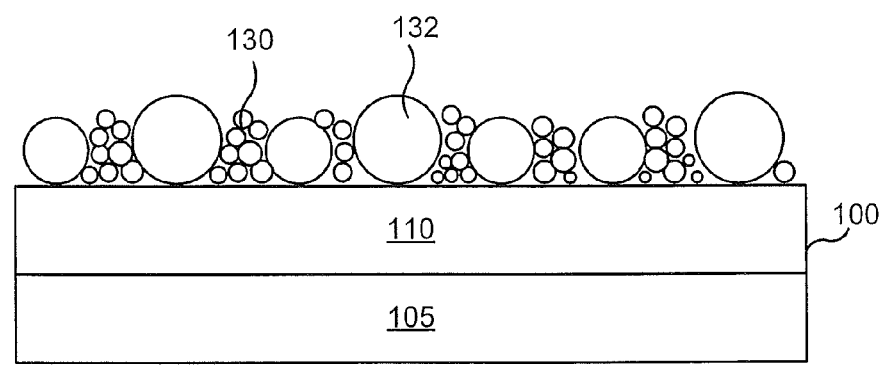

In some embodiments, different sized phosphors can be used to promote phosphor organization. For example, as shown in FIGS. 16A and 16B, a larger transparent particle 132, such as a glass bead or ball (which are commercially available in various RI grades) may be deposited first. Then gaps between the larger particles 132 may be filled with smaller phosphor particles 130.

Figure 16C:
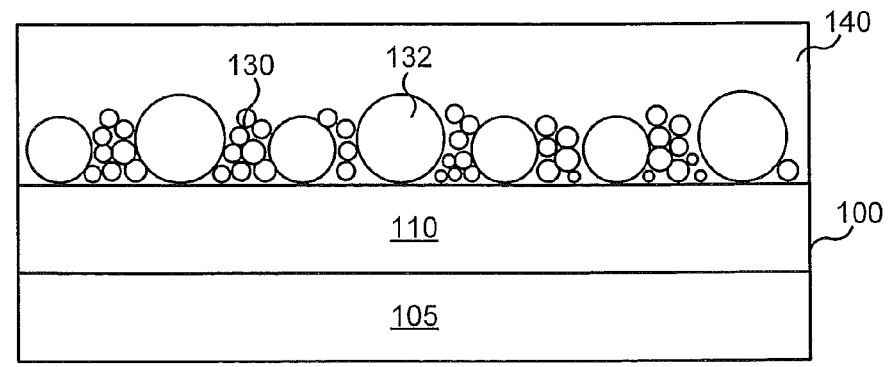

As shown in FIG. 16C, an overlayer 140 may be formed on the LED structure 100 including the phosphor particles 130 and transparent particles 132. The overlayer 140 may include, for example, a layer of silicone or other encapsulant material, and in some embodiments may include a phosphor-loaded material. In some embodiments, the overlayer 140 may include a different phosphor material from the phosphor material contained in the phosphor particles 130. The overlayer 140 may include other materials/structures that can change optical properties of light emitted by the LED structure 100. For example, the overlayer 140 can include optical diffusing/scattering particles and/or the overlayer 140 can be textured and/or patterned to increase optical extraction from the device.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:
1. A semiconductor device, comprising:
a diode structure configured to emit light upon the application of a voltage thereto;
a plurality of discrete phosphor-containing regions spaced apart laterally on an external surface of the diode structure and configured to receive light emitted by the diode structure and to convert at least a portion of the received light to a different wavelength than a wavelength of light emitted by the diode structure; and an overlayer comprising a phosphor-loaded material on the diode structure, wherein the plurality of discrete phosphor containing regions are between the overlayer and the diode structure, wherein the plurality of discrete phosphor-containing regions comprise a first plurality of spaced apart phosphor-containing regions comprising a first type of phosphor configured to convert light emitted by the diode structure to a first wavelength and a second plurality of spaced apart phosphor-containing regions comprising a second type of phosphor configured to convert light emitted by the diode structure to a second wavelength that is different from the first wavelength, wherein the second plurality of spaced apart phosphor containing regions are free of the first type of phosphor;

wherein adjacent ones of the first plurality of phosphor-containing regions are spaced apart from one another on the external surface of the diode structure with intervening ones of the second plurality of phosphor containing regions therebetween.

2. The semiconductor device of claim 1, wherein the first plurality of spaced apart phosphor containing regions are in direct contact with respective ones of the second plurality of spaced apart phosphor containing regions.

3. The semiconductor device of claim 2, further comprising a third plurality of spaced apart phosphor-containing regions comprising a phosphor configured to convert light emitted by the diode structure to a third wavelength, wherein the third wavelength comprises a wavelength in the blue portion of the spectrum.

4. The semiconductor device of claim 1, wherein the first plurality of spaced apart phosphor containing regions and the second plurality of spaced apart phosphor containing regions form a continuous layer of phosphor containing regions on the surface of the diode structure.

5. The semiconductor device of claim 1, wherein the first wavelength comprises a wavelength in the yellow portion of the spectrum, the second wavelength comprises a wavelength in the red portion of the spectrum, and the diode structure is configured to emit light in the blue or UV portions of the spectrum.

6. The semiconductor device of claim 1, wherein the first wavelength comprises a wavelength in the red portion of the spectrum, the second wavelength comprises a wavelength in the green portion of the spectrum, and the diode structure is configured to emit light in the blue or UV portions of the spectrum.

7. The semiconductor device of claim 1, wherein the overlayer comprises light scattering particles.

8. The semiconductor device of claim 1, wherein the overlayer comprises a phosphor that is different from phosphors in the discrete phosphor-containing regions.

9. The semiconductor device of claim 1, wherein the overlayer has a roughened surface opposite the diode structure.

10. The semiconductor device of claim 1, further comprising a light scattering layer, wherein the plurality of discrete phosphor-containing regions are on the light scattering layer.

11. The semiconductor device of claim I, wherein the first plurality of spaced apart phosphor containing regions and the second plurality of spaced apart phosphor containing regions are arranged in an alternating pattern on the surface of the diode structure.

12. The semiconductor device of claim 11, wherein each of the first plurality of spaced apart phosphor containing regions is in direct contact with a neighboring one of the second plurality of spaced apart phosphor containing regions.

13. The semiconductor device of claim 1, wherein a distribution of the first plurality of spaced apart phosphor containing regions laterally adjacent to the second plurality of spaced apart phosphor containing regions is uniform.

14. The semiconductor device of claim 1, wherein the overlayer comprises a third type of phosphor that is different than the first type of phosphor in the first plurality of spaced apart phosphor-containing regions.

15. The semiconductor device of claim 14, wherein the overlayer comprises light scattering particles in addition to the third type of phosphor.

16. The semiconductor device of claim 14, wherein the overlayer comprises a textured surface.

17. The semiconductor device of claim 14, wherein the overlayer comprises a patterned surface.

* * * * *

UNITED STATES PATENT AND TRADEMARK OFFICE
CERTIFICATE OF CORRECTION

PATENT NO. : 9,054,282 B2  
APPLICATION NO. : 12/976769  
DATED : June 9, 2015  
INVENTOR(S) : Andrews et al.

Page 1 of 1

It is certified that error appears in the above-identified patent and that said Letters Patent is hereby corrected as shown below:

On Title Page:
Item (56) Delete "JP   2006604265 (A) 2/2006"
         Insert -- JP   2006504265 (A) 2/2006 --

Signed and Sealed this
Fifteenth Day of March, 2016

Michelle K. Lee
*Director of the United States Patent and Trademark Office*